(12) United States Patent
Obata et al.

(10) Patent No.: US 8,110,825 B2
(45) Date of Patent: Feb. 7, 2012

(54) ORGANIC LIGHT-EMITTING ELEMENT IN WHICH EACH OF A PLURALITY OF UNIT PIXELS HAS TWO TYPES OF PARTITIONS TO DIVIDE AN ORGANIC LIGHT-EMITTING LAYER, ORGANIC LIGHT-EMITTING TRANSISTOR AND LIGHT-EMITTING DISPLAY DEVICE HAVING THE ORGANIC LIGHT-EMITTING ELEMENT

(75) Inventors: Katsunari Obata, Tokyo (JP); Shinichi Handa, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 156 days.

(21) Appl. No.: 12/448,673

(22) PCT Filed: Dec. 28, 2007

(86) PCT No.: PCT/JP2007/075292
§ 371 (c)(1),
(2), (4) Date: Jun. 30, 2009

(87) PCT Pub. No.: WO2008/084743
PCT Pub. Date: Jul. 17, 2008

(65) Prior Publication Data
US 2010/0090203 A1    Apr. 15, 2010

(30) Foreign Application Priority Data
Jan. 9, 2007  (JP) ................................. 2007-001165

(51) Int. Cl.
*H01L 29/08* (2006.01)
(52) U.S. Cl. ........................... 257/40; 313/504; 313/506
(58) Field of Classification Search .................... 257/40; 313/504
See application file for complete search history.

(56) References Cited

U.S. PATENT DOCUMENTS
6,414,432 B1 * 7/2002 Hieda et al. .................... 313/506
(Continued)

FOREIGN PATENT DOCUMENTS
| JP | H11-040354 A | 2/1999 |
| JP | 2002-343578 A | 11/2002 |
| JP | 2003-187983 A | 7/2003 |

(Continued)

OTHER PUBLICATIONS

K. Nakamura, "Fabrication of Vertical-type Organic Light-emitting Transistors," Extended Abstracts (The 66$^{th}$ Autumn Meeting), *Japan Society of Applied Physics*, No. 3, Sep. 7, 2005, p. 1177 (English translation enclosed).

K. Obata et al., "Fabrication of vertical-type organic light-emitting transistors using semiconductor polymer," Extended Abstracts (The 67$^{th}$ Autumn Meeting), *Japan Society of Applied Physics*, No. 3, Aug. 29, 2006, p. 1236 (English translation enclosed).

(Continued)

*Primary Examiner* — David Vu
*Assistant Examiner* — Caleb Henry
(74) *Attorney, Agent, or Firm* — Posz Law Group, PLC

(57) ABSTRACT

An organic light-emitting element comprises a large number of unit pixels each at least composed of a base, an auxiliary electrode, a first insulating layer to cover at least the auxiliary electrode, a charge injection layer on the first insulating electrode, laminated bodies each consisting of a first electrode and a second insulating layer and provided in a predetermined pattern, an organic light-emitting layer formed in regions where the laminated bodies are not provided, and a second electrode to cover at least the organic light-emitting layer. The unit pixel has first partitions provided to demarcate the organic light-emitting layer from other adjacent unit pixels and at least one or more second partitions to have a uniform coated thickness, and at least one of the first partition and the second partition is the laminated body.

14 Claims, 24 Drawing Sheets

U.S. PATENT DOCUMENTS

| | | | |
|---|---|---|---|
| 6,806,643 | B2 | 10/2004 | Hayashi et al. |
| 7,042,154 | B2 * | 5/2006 | Kobayashi .................... 313/506 |
| 2003/0213952 | A1 | 11/2003 | Iechi et al. |
| 2005/0067946 | A1 | 3/2005 | Park |

FOREIGN PATENT DOCUMENTS

| | | |
|---|---|---|
| JP | 2003-324203 A | 11/2003 |
| JP | 2005-520302 A | 7/2005 |
| JP | 2005-243871 A | 9/2005 |
| JP | 2006-164864 A | 6/2006 |

OTHER PUBLICATIONS

K. Kudo, "Recent Progress and Future Trend of Organic Transistors," Oyo Buturi: *Japan Society of Applied Physics*, vol. 72, No. 9 (2003), pp. 1151-1156 (Partial English translation enclosed; discussed on pp. 2 & 3 of the Specification).

International Search Report mailed on Apr. 8, 2008 for the corresponding International patent application No. PCT/JP2007/075292 (English translation enclosed).

* cited by examiner

ORGANIC LIGHT-EMITTING ELEMENT IN WHICH EACH OF A PLURALITY OF UNIT PIXELS HAS TWO TYPES OF PARTITIONS TO DIVIDE AN ORGANIC LIGHT-EMITTING LAYER, ORGANIC LIGHT-EMITTING TRANSISTOR AND LIGHT-EMITTING DISPLAY DEVICE HAVING THE ORGANIC LIGHT-EMITTING ELEMENT

TECHNICAL FIELD

The present invention relates generally to an organic light-emitting element, an organic light-emitting transistor, and a light-emitting display device and particularly to an organic light-emitting element having an organic light-emitting layer that is formed by coating and that has a uniform thickness and that realizes uniform light emission in any part. Further, the present invention relates to an organic light-emitting transistor and light-emitting display device comprising the organic light-emitting element.

BACKGROUND

Organic EL (organic electroluminescence) elements have a simple element structure and are expected to be light-emitting elements for the next-generation display that will be thin, be lightweight, have a large area, and be low cost.

The organic EL element is considered to be driven more effectively in operation speed and power consumption in the field effective transistor (FET) active matrix system using thin film transistors (TFTs) than in the simple matrix system. Meanwhile, as for the semiconductor materials configuring the thin film transistors, more research is recently conducted on organic thin film transistors (organic TFTs) using organic semiconductor materials, in addition to inorganic semiconductor materials such as silicon semiconductors and compound semiconductors. Such organic semiconductor materials are expected to be the next generation semiconductor materials. However, they have some problems such as slow charge moving ratio and high resistance compared with inorganic semiconductor materials.

On the other hand, the static induction transistor (SIT), which is an FET structured vertically, has advantages such as small transistor channel widths, high response speed and large power output because of the effective use of the entire electrode surface, and reduced influence of the interfaces.

Recently, development of organic light-emitting transistors using the aforementioned advantages of the static induction transistor (SIT) and combining the SIT structure and organic EL element structure is under review (see for example Non-Patent Document 1 and Patent Documents 1 and 2). FIG. 23 illustrates a cross-sectional view showing the structure of an organic light-emitting transistor combining the SIT structure and organic EL element structure described in Non-Patent Document 1. An organic light-emitting transistor 101 has, as shown in FIG. 23, a vertical FET structure composed of a source electrode 103 consisting of a transparent conductive film, a hole transporting layer 104 in which a slit-like gate electrode 105 is embedded, a light-emitting layer 106, and a drain electrode 107 provided on a glass base 102 in this order. This composite-type organic light-emitting transistor 101 has the slit-like Schottky gate electrode 105 embedded in the hole transporting layer 104. The hole transporting layer 104 and gate electrode 105 form a Schottky junction so that a depletion layer is formed in the hole transporting layer 104. The extension of the depletion layer changes according to the gate voltage. The gate voltage (the voltage applied between the source electrode 103 and gate electrode 105) is changed to control the channel width and then control the voltage applied between the source electrode 103 and drain electrode 107, whereby the quantity of the emerging charge can be changed.

FIG. 24 illustrates a cross-sectional view showing the structure of an organic light-emitting transistor combining the bottom contact type FET structure and organic EL element structure described in Patent Document 2. An organic light-emitting transistor 111 has, as shown in FIG. 24, an auxiliary electrode 113 and an insulating layer 118 on a base body 112. A positive electrode 115 is formed on the insulating layer 118. A light-emitting layer 116 is formed on the insulating layer to cover the positive electrode 115. Then, a negative electrode 117 is formed thereon. A positive electrode buffer layer 119 is formed on the positive electrode 115 to allow holes to migrate from the positive electrode 115 to the light-emitting layer 116 but inhibit electrons from migrating from the light-emitting layer 116 to the positive electrode 115. Also in the organic light-emitting transistor 111, the voltage applied between the auxiliary electrode 113 and positive electrode 115 is changed to control the channel width and then control the voltage applied between the positive electrode 115 and negative electrode 117, whereby the quantity of the emerging charge can be changed.

Patent Document 3 relates to a light-emitting element in which the growth of dark spots is reduced by providing partitions in a unit pixel to prevent the progress of oxidation of the negative electrode.

[Non-Patent Document 1] Kazuhiro Kudo "The present circumstances and future view of organic transistors", Oyo Butsuri, the 72nd volume, No. 9, pages 1151 to 1156 (2003);
[Patent Document 1] Japanese Laid-open application number 2003-324203 (Claim 1);
[Patent Document 2] Japanese Laid-open application number 2002-343578 (FIG. 23); and
[Patent Document 3] Japanese Laid-open application number H11-40354 (FIG. 2 etc.).

DESCRIPTION OF THE INVENTION

Problem to be Solved by the Invention

In the organic light-emitting transistors combining the SIT structure and organic EL element structure as described in the above Non-Patent Document 1 and Patent Documents 1 and 2, for example referring to FIG. 24 for explanation, when a constant voltage $(-V_{d1}<0)$ is applied between the positive electrode 115 and negative electrode 117, many holes emerge at the surface of the positive electrode 115 that faces the negative electrode 117 and form a flow of the charge (holes) to the negative electrode 117. Here, if a voltage $V_d = -V_{d2} << -V_{d1}$ is applied between the positive electrode 115 and negative electrode 117 in order to obtain a larger flow of the charge (in other words in order to obtain a higher luminescence), the emergence and flow of the charge between the positive electrode 115 and negative electrode 117 becomes dominant and, even if the voltage applied between the auxiliary electrode 113 and positive electrode 115 ($V_g$) is controlled, the quantity of the emerging charge cannot be controlled. Consequently, it is difficult to control the light emission quantity.

In order to obtain organic light-emitting transistors with high productivity, it is proposed to form the charge injection layer and light-emitting layer by organic material applications. For example, an organic material ink is ink-jet discharged, or an organic material ink is attached to a transfer pattern and then transferred. However, when the light-emitting layer formed by coating has an uneven thickness, the light-emitting layer has a luminescence which is different between the thin part and the thick part, possibly causing an uneven light-emission over the entire panel.

Large panels used as illumination panels, such as sign displays, have larger unit pixels of several mm$^2$ compared with the PC display having fine unit pixels of, for example, several tens of μm$^2$. If the ink jet system for producing the above described organic light-emitting transistors (for example, an ink-jet having a discharge rate of 100 picoliters) is used as it is to produce such a large panel with larger unit pixels, a considerable number of discharge operations are necessary within a unit pixel. In such a case, an uneven coating should occur unless the viscosity and drying performance of the ink used is sufficiently controlled. Such an uneven coating results in the light-emitting layer having an uneven thickness. Then, as stated above, the light-emitting layer has a luminescence which is different between the thin part and the thick part. Possible uneven luminescence occurs within a unit pixel as well as over the entire panel.

On the other hand, development of an ink-jet system to fill ink to a thickness in a range of 100 nm to 1.0 μm within a large unit pixel of several mm$^2$ is expected. However, if any existing ink-jet system can be used, facility cost and development cost can significantly be reduced.

The present invention is made to resolve the above problem and the purpose of the present invention is to provide an organic light-emitting element having an organic light-emitting layer formed by a coating to a uniform thickness and realizing uniform light emission in any part, and an organic light-emitting transistor and light-emitting display device comprising the organic light-emitting element.

The other purpose of the present invention is to provide an organic transistor element having a uniform output property and transfer property in the unit element on a two-dimensional array substrate (or array base) on which a large number of FETs are integrated at a high density.

Means for Solving the Problem

The organic light-emitting element of the present invention to resolve the above problem is an organic light-emitting element comprising a large number of unit pixels each at least composed of: a base; an auxiliary electrode provided on the base; a first insulating layer provided so as to cover at least the auxiliary electrode; a charge injection layer provided on the first insulating layer; a laminated body having a first electrode and a second insulating layer and provided either on the first insulating layer or on the charge injection layer in a predetermined pattern; an organic light-emitting layer formed by coating on the charge injection layer in a region where the laminated body is not provided; and a second electrode provided so as to cover at least the organic light-emitting layer, wherein each of the unit pixels has first partitions provided to demarcate the organic light-emitting layer from other adjacent unit pixels and has at least one or more second partitions that are provided between the first partitions and that demarcate the organic light-emitting layer so as to have a uniform coating thickness, and at least one of the first and second partitions is the laminated body.

According to this invention, the unit pixels configuring an organic light-emitting element each have first partitions provided to demarcate the organic light-emitting layer from other adjacent unit pixels and at least one or more second partitions provided between the first partitions and demarcating the organic light-emitting layer so as to have a uniform applied thickness, whereby for example with the second partitions being positioned in consideration of the ink-jet discharge rate which is used, a fixed amount of ink for forming the organic light-emitting layer can be coated on the charge injection layer between the first and second partitions or between the second partitions. Consequently, the organic light-emitting layer formed by coating has the same thickness and then can yield an even luminescence in the unit pixel and further can yield an even light emission over the entire panel. According to the present invention, at least one of the first and second partitions is a laminated body consisting of a first electrode and a second electrode and provided in a predetermined pattern, whereby the charge from the first electrode can be injected into the organic light-emitting layer provided between the first and second partitions or between the second partitions.

In the organic light-emitting element of the present invention, a constant voltage is applied between the first and second electrodes and a variable voltage is applied between the auxiliary and first electrodes to control the light emission quantity. According to this invention, the second insulating layer provided on the first electrode serves to restrain the charge injection. Therefore, when a constant voltage is applied between the first and second electrodes, the emergence of the charge (holes or electrons) at the top surface of the first electrode is restrained and the charge flow to the second electrode is restrained. The charge emerges at the bottom surface or either end surface of the first electrode where the second insulating layer is not provided. Then, the emerging charge is effectively injected into the charge injection layer in contact with the bottom surface or either end surface and proceeds to the second electrode. The current value between the first and second electrodes can be controlled while a constant voltage is applied between the first and second electrodes. Consequently, with the voltage applied between the auxiliary and first electrodes being controlled, the current flow between the first and second electrodes can be controlled to control the light emission quantity. As described above, according to this invention, the organic light-emitting layer formed by the coating has the same thickness and, furthermore, the current flow between the first and second electrodes can be controlled, whereby the light emission quantity can be controlled without an uneven light emission within a unit pixel. Consequently, a large light-emitting panel having a controllable light emission quantity and an even light emission can be provided.

In a preferable embodiment of the organic light-emitting element of the present invention, at least one of the second partitions can be configured by an insulating structure having a predetermined pattern.

According to this invention, at least one of the second partitions are configured by insulating structures provided in a predetermined pattern, whereby, for example, some of the second partitions can be configured by the laminated body with the first electrode and the others can be configured by the insulating structure without the first electrode. Such a configuration is conveniently used to determine the density of the first electrode formed in a unit area on an arbitrary basis. If the insulating structure is formed by an optical material, the light generated in the organic light-emitting layer can be refracted/transmitted to exit from the display surface. In this way, the formation of the second partitions does not result in reducing the light-emitting area.

In a preferable embodiment of the organic light-emitting element of the present invention, some or all of the second partitions can be provided apart from the first partitions.

According to this invention, some or all of the second partitions are provided apart from the first partitions, whereby the area closed by the first and second partitions within a unit pixel can be enlarged. Consequently, a continuous ink-jet discharge operation is available or a larger ink-jet discharge rate can be used, providing an organic light-emitting element with high productivity. Furthermore, larger closed areas lead to a smaller number of partitions configuring the closed areas, preventing the light-emitting area of the organic light-emitting layer formed by coating from being reduced.

In a preferable embodiment of the organic light-emitting element of the present invention, the second partitions can be provided apart from each other.

According to this invention, the second partitions are provided apart from each other, whereby no closed area is formed by the second partitions themselves. Consequently, for example, a continuous ink-jet discharge operation can be performed in the longitudinal direction of the unit pixel, providing an organic light-emitting element with high productivity. Furthermore, a smaller number of partitions configure the closed areas, preventing the light-emitting area of the organic light-emitting layer formed by the coating from being reduced.

In a preferable embodiment of the organic light-emitting element of the present invention, the unit pixel can have a plane area of $0.25$ mm$^2$ or larger.

According to this invention, the unit pixel has a plane area of $0.25$ mm$^2$ or larger, which is preferable for a large panel, such as a sign display, having a light-emitting element with large unit pixels.

In a preferable embodiment of the organic light-emitting element of the present invention, area density of distribution of the second partitions is the same throughout the unit pixels.

According to this invention, the density of multiplayer bodies formed in a unit area is the same or has a predetermined difference in any part of the unit pixel, whereby the current value between the first and second electrodes can be constant while a constant voltage is applied between the first and second electrodes or can have a predetermined difference in any part of the unit pixel. When the density of laminated bodies formed in a unit area is the same in any part, a given value of current flows through the organic light-emitting layer having the same thickness in any part, which is preferably applied to display applications for which an even luminescence or a light emission quantity of the organic light-emission layer is required. On the other hand, when the density of laminated bodies formed in a unit area has a predetermined difference in any part, a light emission distribution is obtained without a drive control, which is preferably applied to large decoration panel applications for which the design is important.

In a preferable embodiment of the organic light-emitting element of the present invention, the charge injection layer can be a layer formed by application.

According to this invention, the charge injection layer provided on the first insulating layer is a layer formed by coating, whereby a fixed amount of ink for forming the charge injection layer can be applied, for example by ink-jet technique. Consequently, the charge injection layer formed by coating has the same thickness, receiving the charge from the first electrode and uniformly injecting it into the organic light-emitting layer.

The organic light-emitting transistor of the present invention to resolve the above problem comprises: the above described organic light-emitting element of the present invention; a first voltage supply means that applies a constant voltage between the first and second electrodes of the organic light-emitting element; and a second voltage supply means that applies a variable voltage between the first and auxiliary electrodes of the organic light-emitting element.

According to this invention, the first voltage supply device and the second voltage supply device are provided, whereby a constant voltage can be supplied between the first and second electrodes and a variable voltage can be supplied between the first and auxiliary electrodes. Consequently, with the voltage being controlled, the quantity of the charge can be changed in a sensitive matter so as to control the current flow between the first and second electrodes for controlling the light emission quantity.

The light-emitting display device of the present invention to resolve the above problem is a light-emitting display device comprising a plurality of light-emitting parts arranged in a matrix, wherein each of the plurality of light-emitting parts has the above described organic light-emitting element of the present invention.

According to this invention, a large light-emitting panel, such as a sign display, can be realized comprising an organic light-emitting element having a large number of unit pixels in which a uniform organic light-emitting layer is formed.

The organic transistor element of the present invention to resolve the above problem is an organic transistor element comprising a large number of unit elements each at least composed of: a base; an auxiliary electrode provided on the base; a first insulating layer provided so as to cover at least the auxiliary electrode; a charge injection layer provided on the first insulating layer; a laminated body having a first electrode and a second insulating layer and provided either on the first insulating layer or on the charge injection layer in a predetermined pattern; an organic semiconductor layer formed by coating on the charge injection layer in a region where the laminated body is not provided; and a second electrode provided so as to cover at least the organic semiconductor layer, wherein each of the unit elements has first partitions provided to demarcate the organic semiconductor layer from adjacent other unit elements and at least one or more second partitions that are provided between the first partitions and that demarcate the organic semiconductor layer so as to have a uniform coating thickness, and at least one of the first and second partitions is the laminated body.

According to this invention, for example with the second partitions being positioned in consideration of the ink-jet discharge rate which is used, a fixed amount of ink for forming the organic semiconductor layer can be coated on the charge injection layer between the first and second partitions or between the second partitions. Consequently, the organic semiconductor layer formed by coating has the same thickness and then can yield uniform characteristics such as a carrier moving speed in the unit element configuring the organic transistor element.

In a preferable embodiment of the organic transistor element of the present invention, at least one of the second partitions can be configured by an insulating structure provided in a predetermined pattern.

The organic light-emitting element of the present invention to resolve the above problem is an organic light-emitting element comprising a large number of unit pixels each at least composed of: a base; an A-electrode provided on the base; a charge injection layer provided so as to cover at least the A-electrode; an insulating structure provided either on the A-electrode or on the charge injection layer in a predetermined pattern; an organic light-emitting layer formed by coating on the charge injection layer in a region where the insulating structures is not provided; and a B-electrode provided so as to cover at least the organic light-emitting layer, wherein each of the unit pixels has first partitions provided to demarcate the organic light-emitting layer from adjacent other unit pixels and at least one or more second partitions that are provided between the first partitions and that demarcate the organic light-emitting layer so as to have a uniform coating thickness, and the second partitions are the insulating structures.

According to this invention, for example with the second partitions being positioned in consideration of the ink-jet discharge rate which is used, a fixed amount of ink for forming the organic light-emitting layer can be coated on the charge injection layer between the first and second partitions or between the second partitions. Consequently, the organic light-emitting layer formed by coating has the same thickness and then can yield an even luminescence in the unit element configuring the organic EL element and further can yield an even light emission over the entire organic EL panel.

In a preferable embodiment of the organic light-emitting element of the present invention, the charge injection layer can be a layer formed by application.

Effect of the Invention

According to the organic light-emitting element of the present invention, a fixed amount of ink for forming the organic light-emitting layer can be coated on the charge injection layer between the first and second partitions or between the second partitions, whereby the organic light-emitting layer formed by coating has the same thickness and then can yield an even luminescence in the unit element and further can yield an even light emission over the entire panel. Furthermore, the charge from the first electrode can be injected into the organic light-emitting layer provided between the first and second partitions or between the second partitions. Furthermore, the presence of the second insulating layer serves to restrain the current value between the first and second electrodes while a contact voltage is applied between the first and second electrodes, whereby with the voltage applied between the auxiliary and first electrodes being controlled, the current flow between the first and second electrodes can be controlled so as to control the light emission quantity.

As described above, according to the organic light-emitting element of the present invention, the organic light-emitting layer formed by coating has the same thickness and the current flow between the first and second electrodes can be controlled, whereby the light emission quantity can be controlled without an uneven light emission in the unit pixel. Consequently, a large light-emitting panel having a controllable light emission quantity and an even light emission can be provided.

According to the organic light-emitting transistor of the present invention, a constant voltage can be coated between the first and second electrodes and a variable voltage can be applied between the first and auxiliary electrodes, whereby with the voltage being controlled, the quantity of the charge can be changed in a sensitive manner so as to control the current flow between the first and second electrodes for controlling the light emission quantity.

According to the light-emitting display device of the present invention, a large light-emitting panel, such as a sign display, can be provided comprising an organic light-emitting element having a large number of unit pixels in which a uniform organic light-emitting layer is formed.

According to the organic transistor element of the present invention, a fixed amount of ink for forming the organic semiconductor layer can be coated on the charge injection layer between the first and second partitions or between the second partitions. Consequently, the organic semiconductor layer formed by coating has the same thickness and then can yield even characteristics such as the carrier moving speed in the unit element configuring the organic transistor element.

According to the organic EL element, that is, the organic light-emitting element of the present invention, a fixed amount of ink for forming the organic light-emitting layer can be coated on the charge injection layer between the first and second partitions or between the second partitions. Consequently, the organic light-emitting layer formed by coating has the same thickness and then can yield an even luminescence in the unit element configuring the EL element and further can yield an even light emission over the entire organic EL panel.

DETAILED DESCRIPTION

The organic light-emitting element, organic light-emitting transistor, and light-emitting display device of the present invention will be described hereafter with reference to the drawings. However, the present invention is not confined to the embodiments below with regard to its technical scope.

Figure 1:
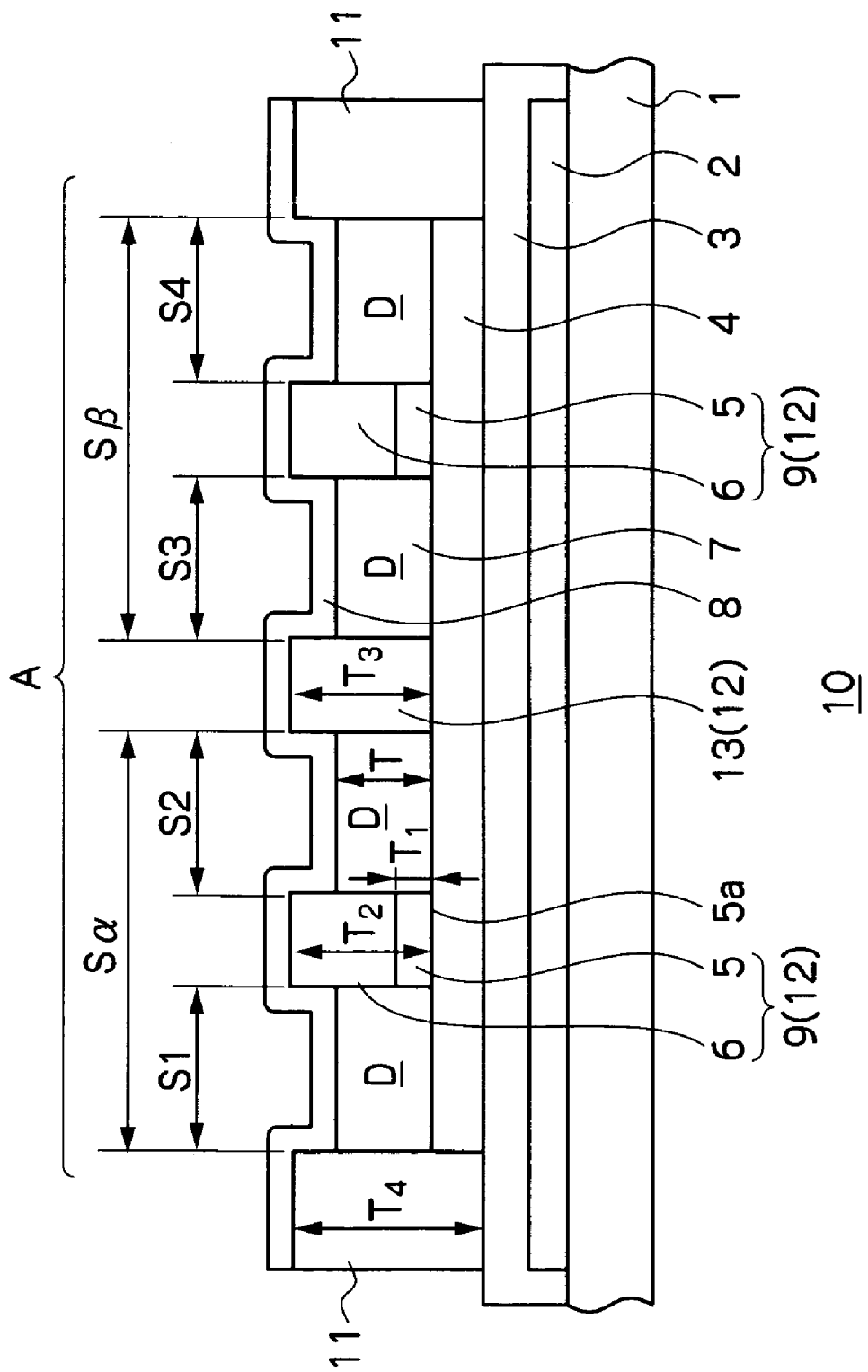
FIG. 1 illustrates a schematic cross-sectional view of an embodiment of the organic light-emitting element of the present invention.

[Organic light-emitting element] FIGS. 1 to 7 illustrate schematic cross-sectional views showing exemplary structures of the organic light-emitting element of the present invention. An organic light-emitting element of the present invention 10 is a field effect type organic light-emitting transistor element having the organic EL element structure and vertical FET structure. For example, referring to FIG. 1, the organic light-emitting element 10 has a large number of unit pixels A each at least composed of a base 1, an auxiliary electrode 2 provided on the base 1, a first insulating layer 3 provided so as to cover at least the auxiliary electrode 2, a charge injection layer 4 provided on the first insulating layer 3, laminated bodies 9 provided on the first insulating layer 3 or on the charge injection layer 4 in a predetermined pattern and each consisting of a first electrode 5 and a second insulating layer 6, an organic light-emitting layer 7 formed by coating on the charge injection layer 4 in regions where the laminated bodies 9 are not provided, and a second electrode 8 provided so as to cover at least the organic light-emitting layer 7. An insulating structure 13 is also provided in the unit pixel A as shown in FIG. 1 and others.

Figure 2:
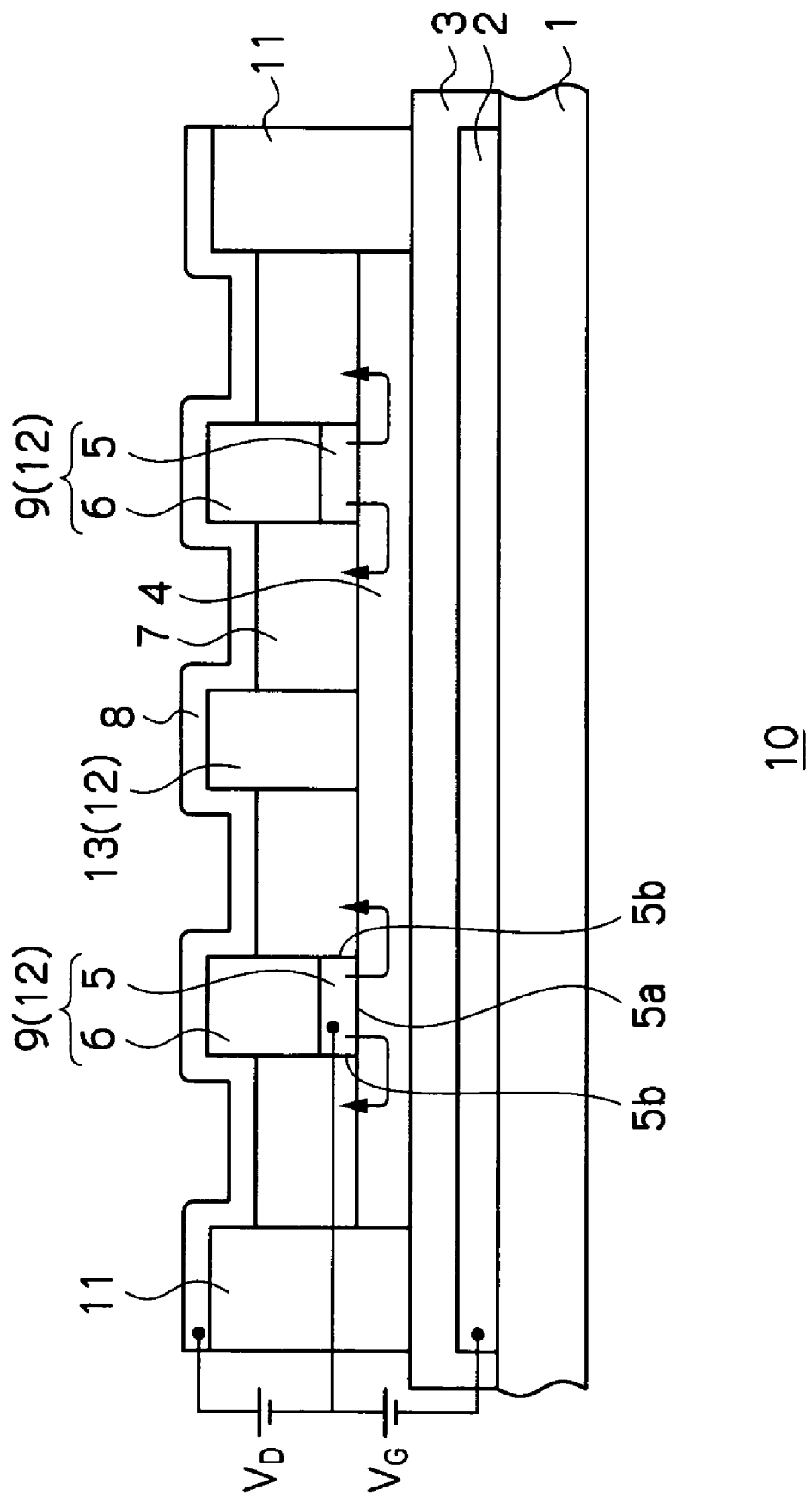
FIG. 2 is an illustration for explaining the concept of the charge flow in the organic light-emitting element in FIG. 1.

In the organic light-emitting element of the present invention 10 shown in FIGS. 1 and 2, the bottom surface of the first electrode 5 is in contact with the charge injection layer 4. A gate voltage $V_G$ applied between the auxiliary electrode 2 and the first electrode 5 causes a charge (holes or electrons). A drain voltage $V_D$ applied between the first electrode 5 and the second electrode 8 serves to transport the charge from the first electrode 5 to the second electrode 8. In the present invention, a constant electric field (the drain voltage $V_D$) is applied between the first electrode 5 and the second electrode 8 and a variable gate voltage $V_G$ is applied between the auxiliary electrode 2 and the first electrode 5 in order to control the quantity of the emerging charge. Consequently, the light emission quantity resulting from a recoupling of the charge transported by the organic light-emitting layer 7 with the charge supplied from the second electrode 8 is controlled.

The above control is achieved by the second insulating layer 6 provided on the first electrode 5 to restrain the charge injection. As shown in FIG. 2, when a constant voltage (the drain voltage $V_D$) is applied between the first electrode 5 and the second electrode 8, the presence of the second insulating layer 6 serves to restrain the emergence of the charge at the top surface of the first electrode 5 and to restrain the flow of the charge to the second electrode 8. Consequently, the charge emerges at the bottom surface 5a or at the edges (ends) 5b that are not covered with the second insulating layer 6 and proceeds to the second electrode 8. Therefore, the current value between the first and second electrodes can be controlled while a constant voltage (the drain voltage $V_D$) is applied between the first electrode 5 and second electrode 8. Consequently, with the voltage applied between the auxiliary electrode 2 and the first electrode 5 (the gate voltage $V_G$) being controlled to assist the emergence of the charge, the emergence of the charge at the first electrode 5 can be controlled so as to control the light emission quantity.

The present invention can be configured with the first electrode 5 being a positive electrode and the second electrode 8 being a negative electrode or with the first electrode 5 being a negative electrode and the second electrode 8 being a positive electrode. Whichever polarity the first electrode 5 and the second electrode 8 have, with the voltage applied between the auxiliary electrode 2 and first electrode 5 being controlled, the quantity of the charge can be changed in a sensitive manner so as to control the current flow between the first and second electrodes for controlling the light emission quantity. Here, in the case that the first electrode 5 is a positive electrode and the second electrode 8 is a negative electrode, the charge injection layer 4 in contact with the first electrode 5 is a hole injection layer; however, the charge injection layer is an electron injection layer when it is provided in contact with the second electrode 8. On the other hand, in the case that the first electrode 5 is a negative electrode and the second electrode 8 is a positive electrode, the charge injection layer 4 in contact with the first electrode 5 is an electron injection layer; however, the charge injection layer is a hole injection layer when it is provided in contact with the second electrode 8.

Figure 6:
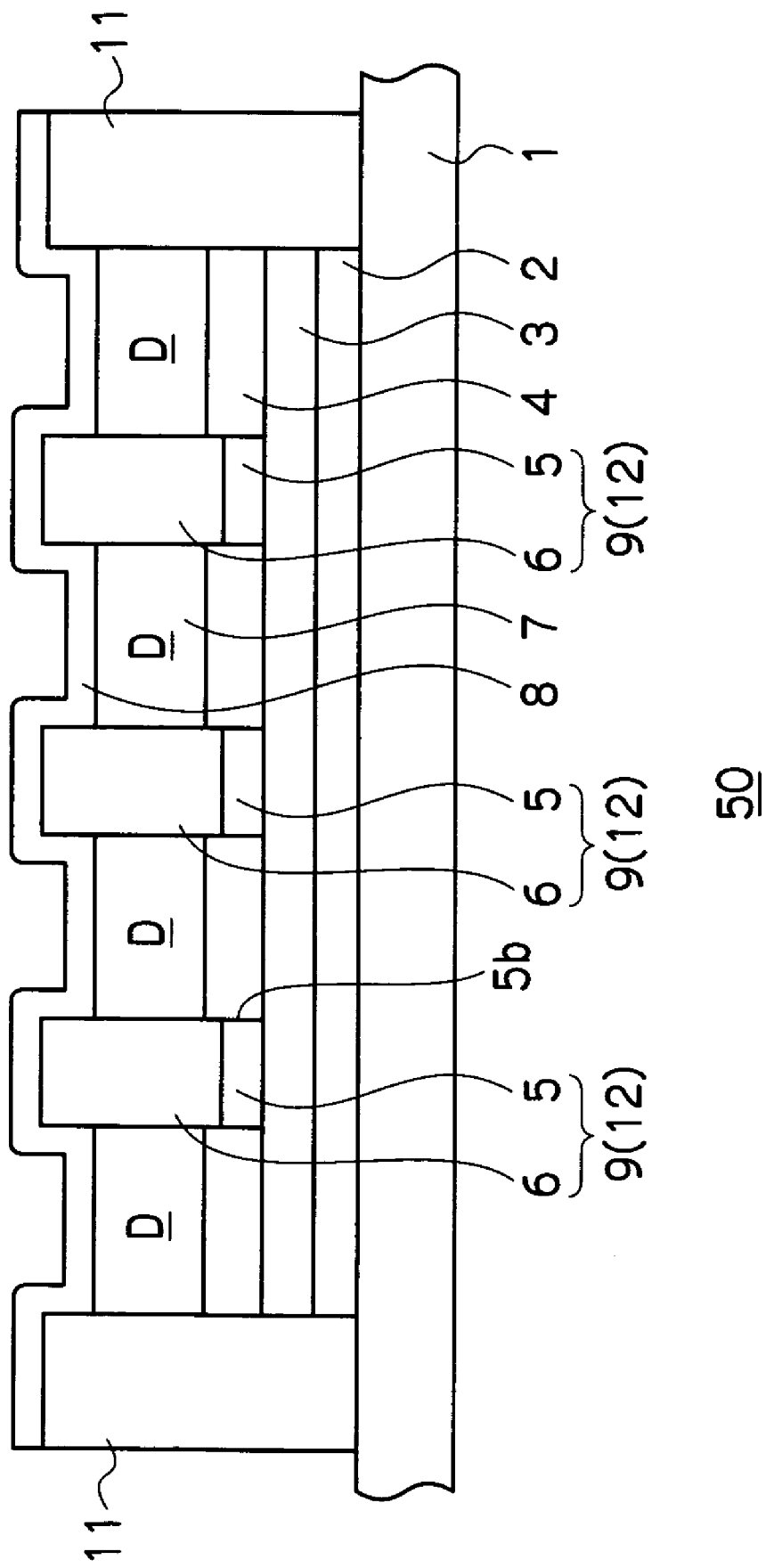
FIG. 6 illustrates a schematic cross-sectional view of another embodiment of the organic light-emitting element of the present invention.

The organic light-emitting element of the present invention 10 can be "a top contact type" in which the first electrode 5 is formed on the charge injection layer 4 and the bottom surface 5a of the first electrode 5 is in contact with the charge injection layer 4 as shown in FIG. 1 or "a bottom contact type" in which the first electrode 5 is formed on the first insulating layer 3 and the edges (ends) 5b, 5b of the first electrode 5 are in contact with the charge injection layer 4 as shown in FIG. 6. In these configurations, the organic material layer including at least the charge injection layer 4 and organic light-emitting layer 7 (the organic layer, hereafter) can have various laminated configurations. For example, the organic layer can include a hole transporting layer, an electron transporting layer, and an electron injection layer or a proper combination of these. Furthermore, the organic light-emitting layer 7 can contain a hole transport material or an electron transport material.

Furthermore, the organic light-emitting element of the present invention can be a top emission type light-emitting transistor element or a bottom emission type light-emitting transistor element. The light transmittance of the formed layers is designed depending on the type. The cross-sectional views of the organic light-emitting element given in this application show a unit pixel A (one pixel) of the organic light-emitting transistor. Then, the organic light-emitting layer 7 can be formed in each unit pixel A to emit a predetermined color light so as to produce a light-emitting display device such as a color display.

(Partitions) A unit pixel A configuring the organic light-emitting element 10 emits the same color light throughout the unit pixel A, forming a minimum unit for light emission control. The unit pixel A has, as shown in FIGS. 1 to 7, first partitions 11 provided to demarcate the organic light-emitting layer 7 from other adjacent unit pixels and at least one or more second partitions 12 provided between the first partitions 11 and demarcating the organic light-emitting layer 7 so as to have a uniform coated thickness T. Here, at least one of the first partition 11 and the second partition 12 is the aforementioned laminated body 9. Hence, the laminated body 9 consisting of the first electrode 5 and the second insulating layer 6 can be used to configure the first partition 11 or the second partition 12, or both the first partition 11 and the second partition 12. Insulating material partitions are used to provide the first partition 11 or the second partition 12 when they are not configured by the laminated body 9.

Furthermore, as shown in FIG. 1 and others, some of a plurality of the second partitions 12 can be configured by insulating structures 13 provided in a predetermined pattern. In such a case, for example, some of the second partitions are configured by the laminated body 9 with the first electrode 5 and the others are configured by the insulating structure 13 without the first electrode 5. This configuration is conveniently used to determine the density of the first electrode 5 formed in a unit area on an arbitrary basis. If the insulating structure 13 is formed by an optical material, light generated in the organic light-emitting layer 7 can be refracted/transmitted to exit from the display surface. In this way, the formation of the second partitions 12 consisting of the insulating structure 13 advantageously does not result in reducing the light-emitting area.

The charge injection layer 4, the organic light-emitting layer 7, and other layers are formed in a unit pixel A. These layers are formed in predetermined coating regions D divided by the partitions, for example as shown in FIGS. 9 to 17.

Figure 3:
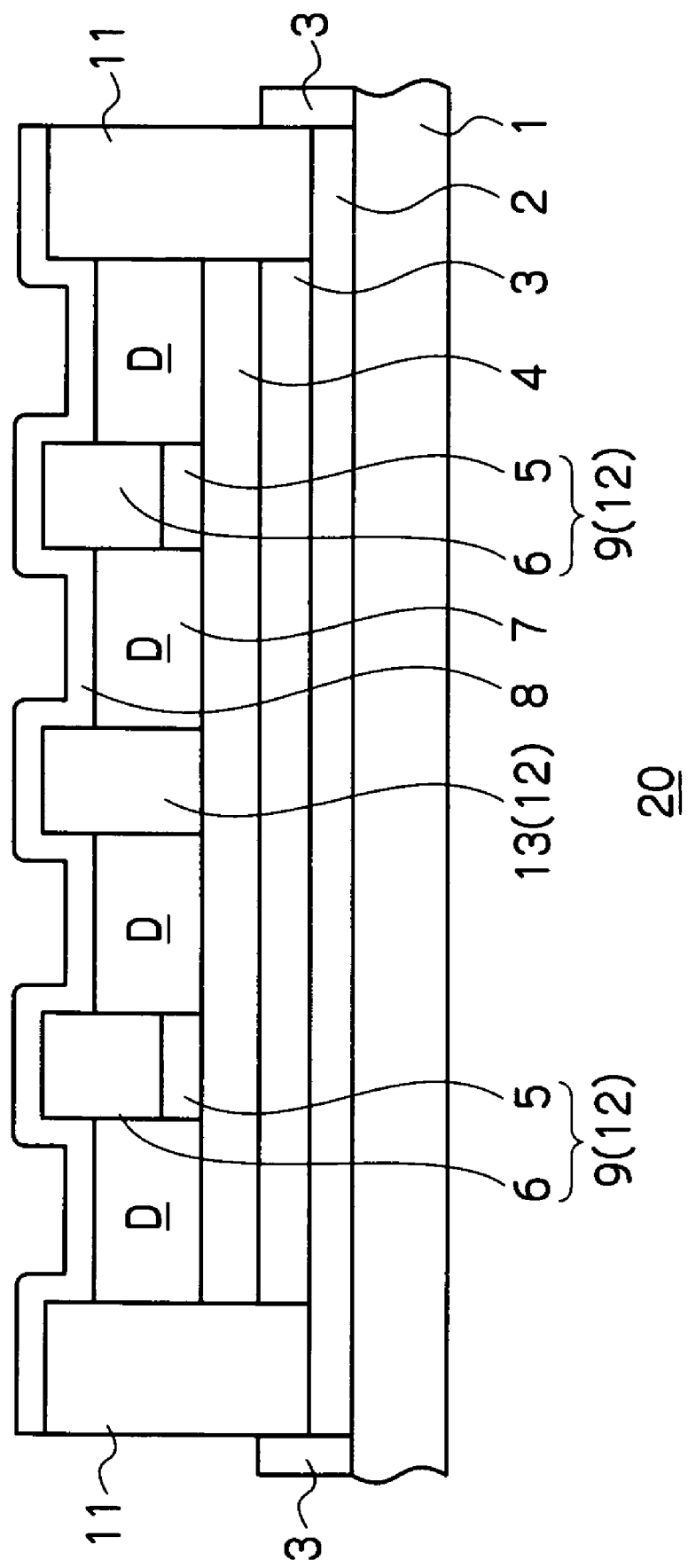
FIG. 3 illustrates a schematic cross-sectional view of another embodiment of the organic light-emitting element of the present invention.
Figure 4:
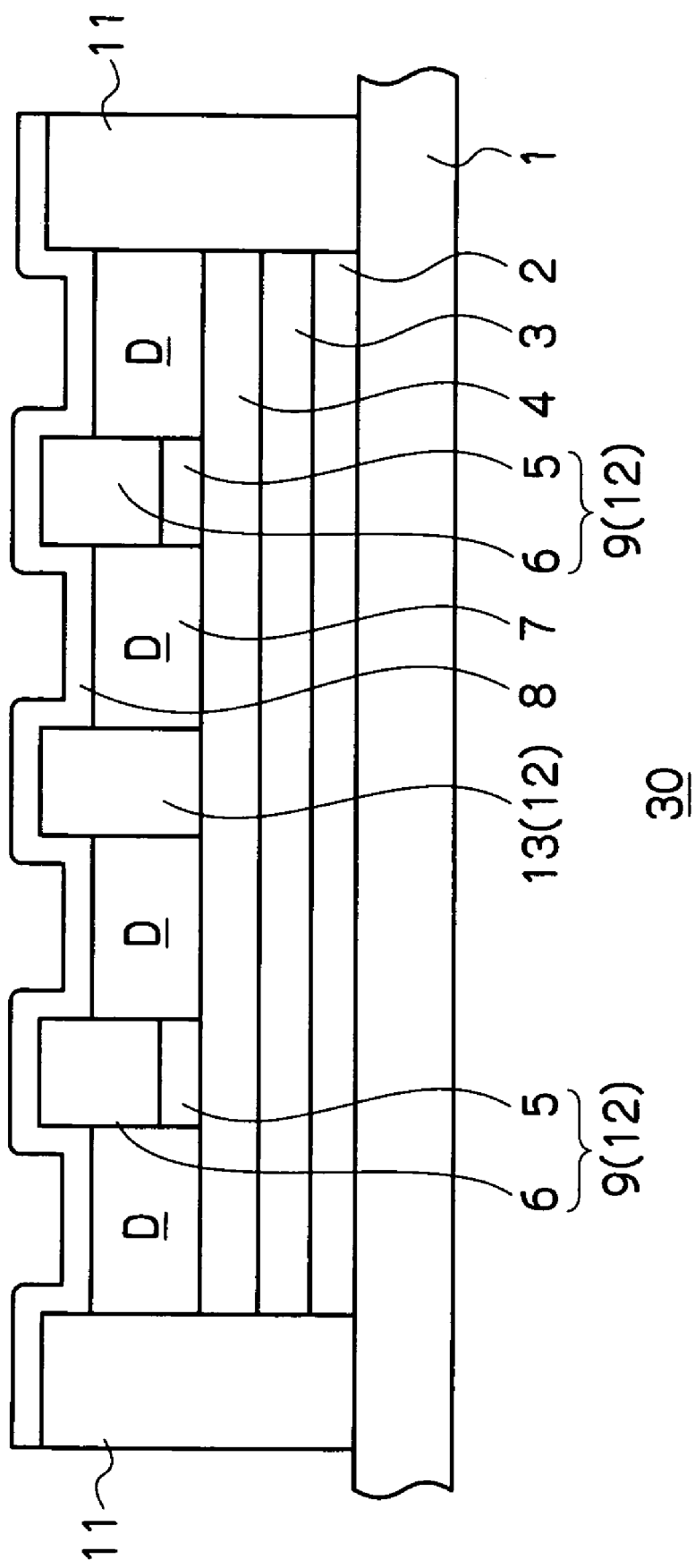
FIG. 4 illustrates a schematic cross-sectional view of another embodiment of the organic light-emitting element of the present invention.

The first partitions 11 demarcate the organic light-emitting layer 7 from other adjacent unit pixels to form an area segmented to emit a single color light on the plane of the light-emitting device having the organic light-emitting element 10. The first partitions 11 can be provided on the first insulating layer 3 as shown in FIG. 1, on the auxiliary electrode 2 as shown in FIG. 3, or on the base 1 as shown in FIG. 4. The first partitions 11 can be formed by various conventional partition materials, including photosensitive resin, activation energy ray curable resin, thermosetting resin, and thermoplastic resin. The first partitions 11 can be formed by a means appropriate for the partition material selected, including thick film printing and patterning using photosensitive resist.

The first partitions 11 are formed to demarcate the organic layer including the organic light-emitting layer 7. Therefore, it is preferable that the first partitions 11 have the top surface above the level of the organic light-emitting layer 7. The width of the first partitions 11 is not particularly restricted.

The second partitions 12 are provided between the first partitions 11 and to demarcate the organic light-emitting layer 7 so that an coated thickness T is uniform. Desirably, at least one or more second partitions 12 are provided in a cross-sectional view of a unit pixel A.

The second partitions 12 can be formed by alternately arranging the laminated body 9 with the first electrode 5 and the insulating structure 13 without the first electrode 5 as shown in FIG. 1 and others. In this way, the density of the first electrode 5 formed in a unit area can be fixed while the volume V of the organic light-emitting layer 7 within the coating region D is fixed. Then, the quantity of the charge supplied to the organic light-emitting layer 7 in each coating region D can be equal. More specifically, a constant voltage $(V_D)$ is applied between the first electrode 5 and the second electrode 8 and a variable voltage $(V_G)$ is applied between the auxiliary electrode 2 and first electrode 5. Then, as shown in FIG. 2, among the charge emerging at the bottom surface 5a of the first electrode 5, the quantity of the charge transported to the organic light-emitting layer 7 on the left side of the laminated body 9 and the quantity of the charge transported to the organic light-emitting layer 7 on the right side of the laminated body 9 are equal. Consequently, the light emission quantity through recoupling in each coating region D can be at the same level.

In this way, with the density of the electrode 5 formed in a unit area being equal in any part of the pixel unit A, the current value between the first and second electrodes while a contact voltage is applied between the first electrode 5 and second electrode 8 can be constant in any part of the unit pixel A. Consequently, a constant value of the current flows through the organic light-emitting layer 7 formed to a uniform thickness in any part and the organic light-emitting layer 7 yields an even luminescence or light emission quantity.

In the partition configuration shown in FIG. 1, the first partitions 11 demarcating a unit pixel A are formed on the first insulating layer 3 and the second partitions 12 are formed on the charge injection layer 4 within the demarcated area. The second partitions 12 in this configuration are configured by an insulating structure 13 dividing the unit pixel A into subregions Sα and Sβ in a cross-section and the laminated bodies 9 dividing the subregions Sα and Sβ into a plurality of smaller subregions (S1, S2, S3, S4) in a cross-section. More specifically, the second partition 12 consisting of the insulating structure 13 configuring the subregions Sα and Sβ is placed at a predetermined position in a predetermined size so that the first electrode 5 of the laminated body 9 is formed at a uniform density within the unit pixel A. The laminated body 9 is generally placed at a predetermined position in a predetermined size so that the first electrode 5 of the laminated body 9 is formed at a uniform density within the unit pixel A regardless of the presence/absence of the insulating structure 13. In FIG. 1, the symbols Sα and Sβ indicate the distance between the first partition 11 and the insulating structure 13, the symbols S1 and S4 indicate the distance between the first partition 11 and the laminated body 9, and the symbols S2 and S3 indicate the distance between the laminated body 9 and the insulating structure 13. These distances are determined so that the organic light-emitting layer 7 has the same thickness T in any part. The height (thicknesses) T4 of the first partition 11, the height (thicknesses) T2 of the laminated body 9, and the height (thicknesses) T3 of the insulating structure 13, respectively, are generally determined so that their top surfaces are at a level equal to or higher than the top surface of the organic light-emitting layer 7.

Figure 9:
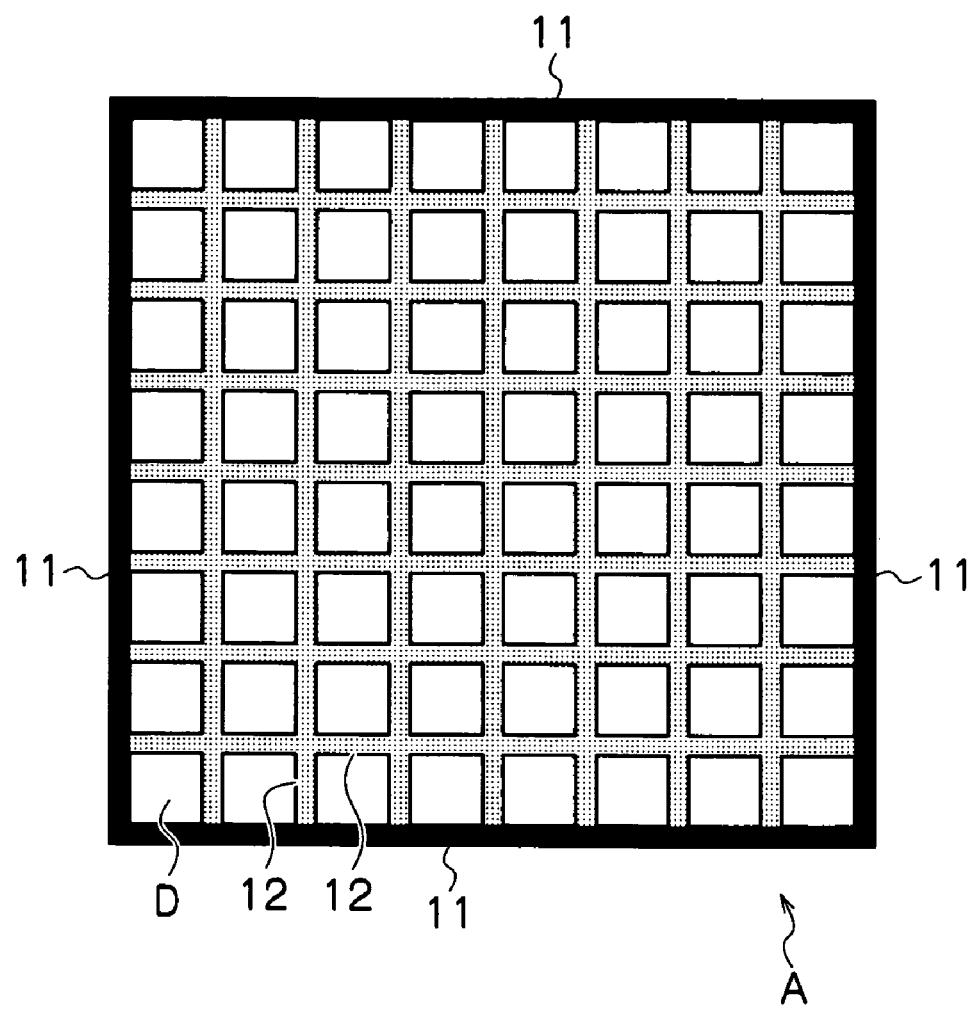
FIG. 9 illustrates a plan view of a partition configuration relating to the present invention.
Figure 13:
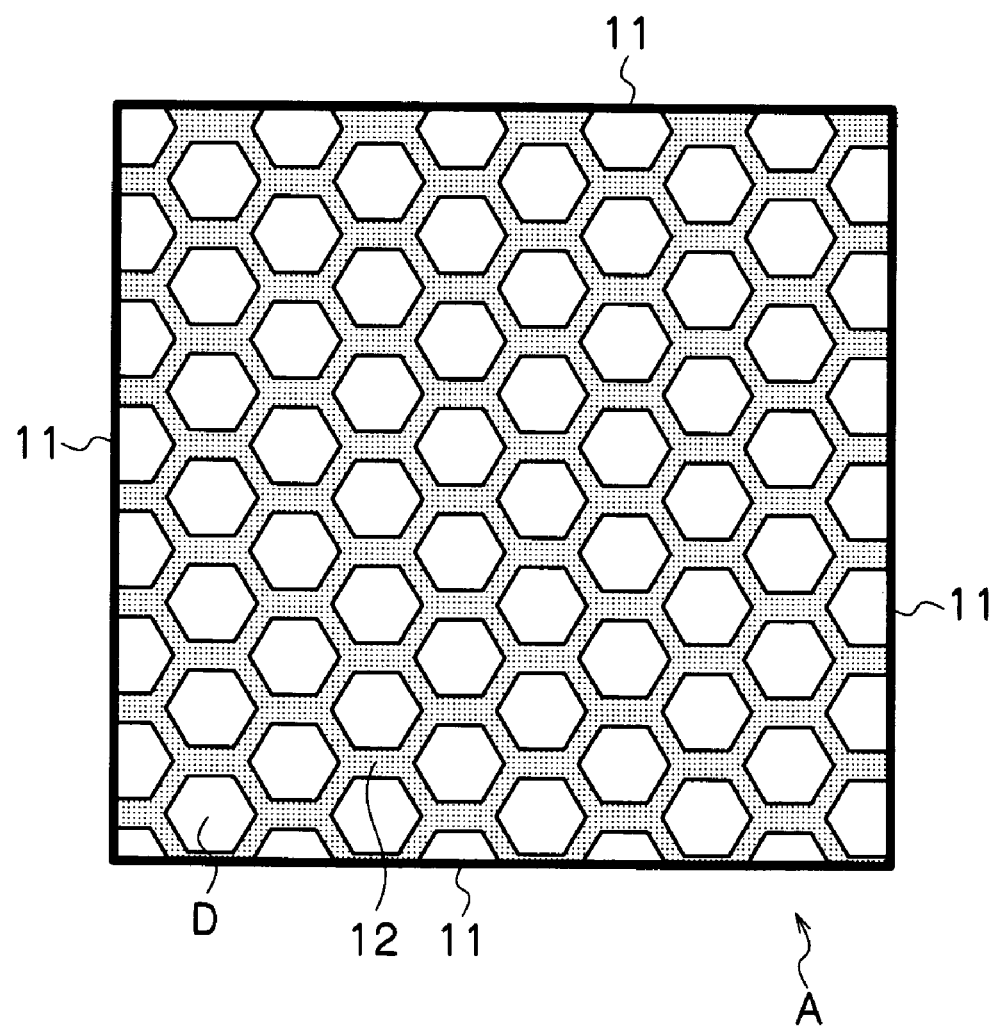
FIG. 13 illustrates a plan view of another partition configuration relating to the present invention.
Figure 15:
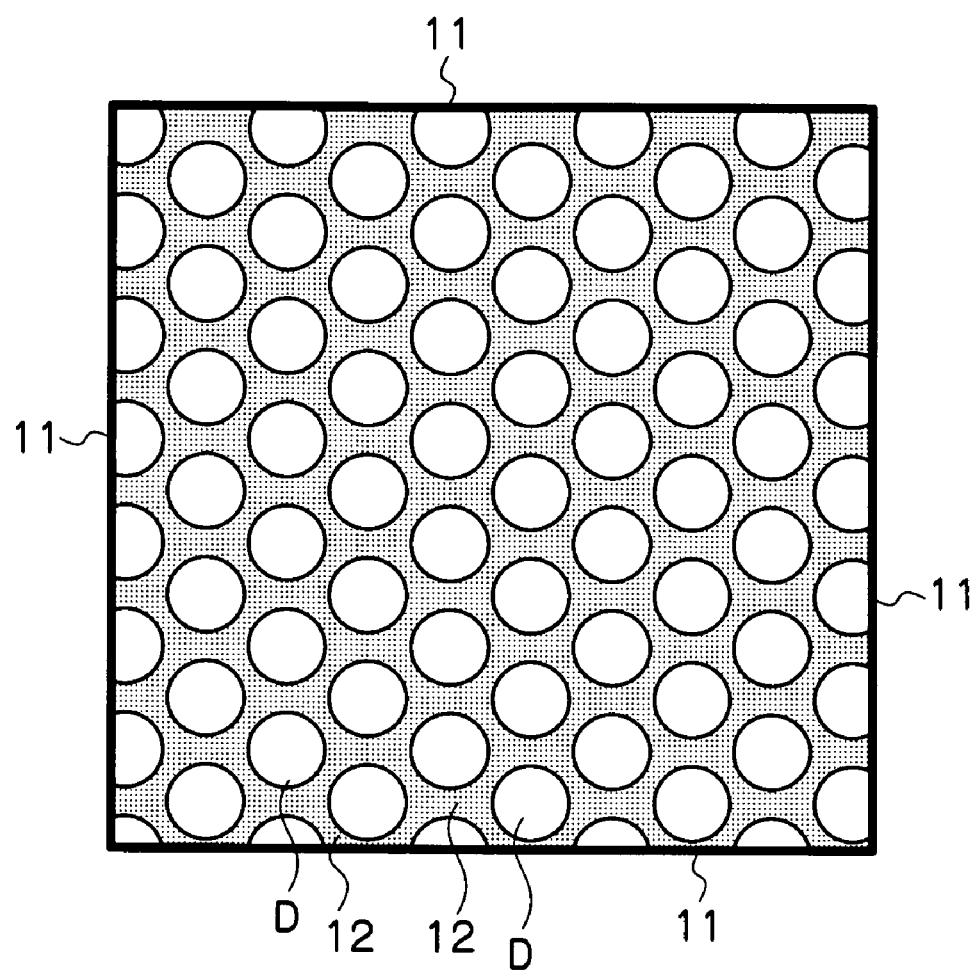
FIG. 15 illustrates a plan view of another partition configuration relating to the present invention.

As a means for forming the organic light-emitting layer 7 having the same thickness T in any part, for example, the organic light-emitting layer 7 can be formed by an ink-jet technique. In such a case, the organic light-emitting layer 7 filling the coating region D formed by diving a unit pixel A by the first partitions 11 and the second partitions 12 is designed to have a predetermined volume V, for example as shown in FIGS. 9, 13, and 15, which will be described later. As described above, a unit pixel A is divided to form the organic light-emitting layer 7 having a predetermined volume V, and an ink-jet device having a capacity per shot equal to the volume V or an ink-jet device having a capacity amounting to the volume V by a predetermined number of shots is used, whereby the organic light-emitting layer 7 in the coating regions D can be realized to have the same thickness T. Conversely, if the coating regions D are formed in accordance with the discharge rate per shot or the capacity of a predetermined number of shots of an existing ink-jet device, advantageously, no new ink-jet device is necessary.

Generally, a plurality of ink-jet devices are used for discharging (or coating) ink for forming the organic light-emitting layer in the coating regions D of a unit pixel A. In such a case, the ink-jet devices can have all the same discharging rate or different discharging rates. When the ink-jet devices have different discharging rates, the volume V of an coating region D is determined in accordance with the discharging rate of an ink-jet device assigned thereto. The coating regions D in a unit pixel A do not always have the same volume V; the coating regions D do not need to be formed in a repeated pattern and to have the same volume as shown in FIGS. 9, 13, and 15, which will be described later.

As a means for forming the organic light-emitting layer 7 having the same thickness T in any part, the above technique can preferably be used for example when the organic light-emitting layer 7 is formed by the transfer method. The process of forming the organic light-emitting layer 7 by the transfer method will be briefly described. First, the transfer method utilizes a printing matrix corresponding to the coating regions D of a unit pixel A. Ink for forming the organic light-emitting layer is coated on the printing matrix by gravure printing, flexo printing, or offset printing and transferred to the coating regions D. The transfer method requires the formation of a printing matrix corresponding to the coating regions D and the transfer with accurate positioning, which is somewhat troublesome. Accepting such aspects, the transfer method yields the same efficacy as the above use of an ink-jet device.

On the other hand, the coating regions between the partitions 12 consisting of the laminated body 9 or the insulating structure 13 are also processed as described above. In the case shown in FIG. 1, the insulating structure 13 is placed between the laminated bodies 9. The subregions S1 and S2 or S3 and S4, which are divided by the laminated body 9, are provided at equal intervals. This is for the first electrode 5 to bear a nearly equal electric field. More specifically, a constant voltage ($V_D$) is applied between the first electrode 5 and second electrode 8 and a variable electrode ($V_G$) is applied between the auxiliary electrode 2 and first electrode 5. As shown in FIG. 2, among the charge emerging at the bottom surface 5a of the first electrode 5, the quantity of the charge transported to the organic light-emitting layer 7 on the first partition 11 side (S1 or S4) and the quantity of the charge transported to the organic light-emitting layer 7 on the adjacent insulating structure 13 side (S2 or S3) can be balanced and the same quantity of the charge is supplied to each organic light-emitting layer 7. Then, the light emission quantity through recoupling in each coating region D can be at the same level. Here, a means for adjusting the light emission quantity in the coating regions D is described by way of example. This means is not restrictive and other adjustment means such as variable voltage control can be used.

An organic light-emitting element 20 shown in FIG. 3 has the same partition configuration as the one shown in FIG. 1 except that the first partitions 11 demarcating a unit pixel A are formed on the auxiliary electrode 2 and, therefore, the same reference numbers are used and their explanation is omitted. An organic light-emitting element 30 shown in FIG. 4 has the same partition configuration as the one shown in FIG. 1 except that the first partitions 11 demarcating a unit pixel A are formed on the base 1 and, therefore, the same reference numbers are used and their explanations are omitted.

Figure 5:
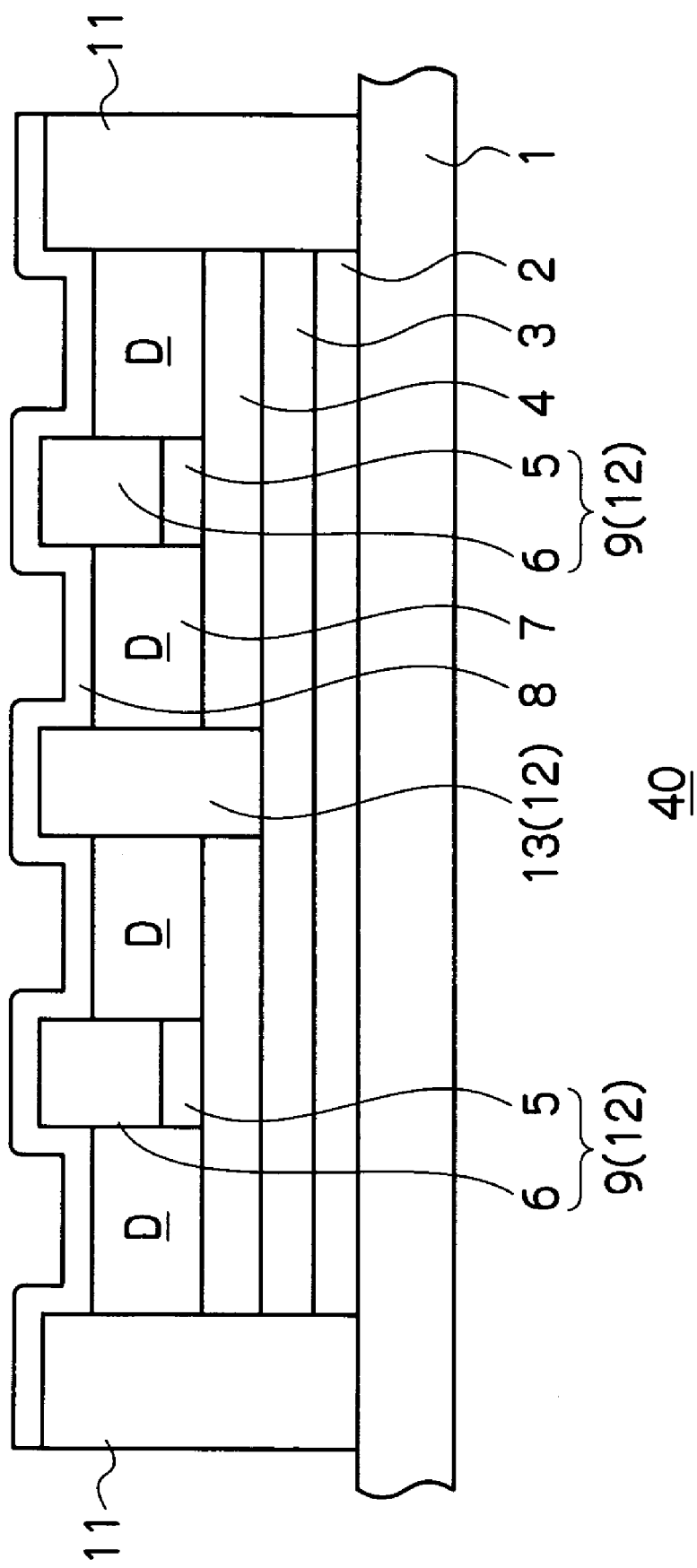
FIG. 5 illustrates a schematic cross-sectional view of another embodiment of the organic light-emitting element of the present invention.

An organic light-emitting element 40 shown in FIG. 5 has the same partition configuration as the organic light-emitting element 30 shown in FIG. 4 except that the second partition 12 consisting of the insulating structure 13 is provided on the first insulating layer 3 and the charge injection layer 4 is provided on the first insulating layer 3 between the partitions and, therefore, the same reference numbers are used and their explanation is omitted. In the organic light-emitting element 40 shown in FIG. 5, the insulating structure 13 on the first insulating layer 3 can be replaced with a laminated body 9 with the first electrode 5. In such a case, the charge emerges at the end (both ends) of the first electrode 5 and is injected into the charge injection layer 4 in the same manner as in FIG. 6 described below.

An organic light-emitting element 50 shown in FIG. 6 has the same partition configuration as the organic light-emitting elements 30 and 40 shown in FIGS. 4 and 5 except that the laminated bodies 9 with the first electrode 5 are provided on the first insulating layer 3 at equal intervals and, therefore, the same reference numbers are used and their explanation is omitted. In the organic light-emitting element 50, the charge injection layer 4 is provided on the first insulating layer 3 between the partitions and the organic light-emitting layer 7 is provided on the charge injection layer 4. Furthermore, in this partition configuration, the charge emerges at the end (both ends) 5b, 5b of the first electrode 5 and is injected into the charge injection layer 4. Therefore, the first electrode 5 has to have a minimum thickness T1 to inject the charge into the charge injection layer 4.

Figure 7:
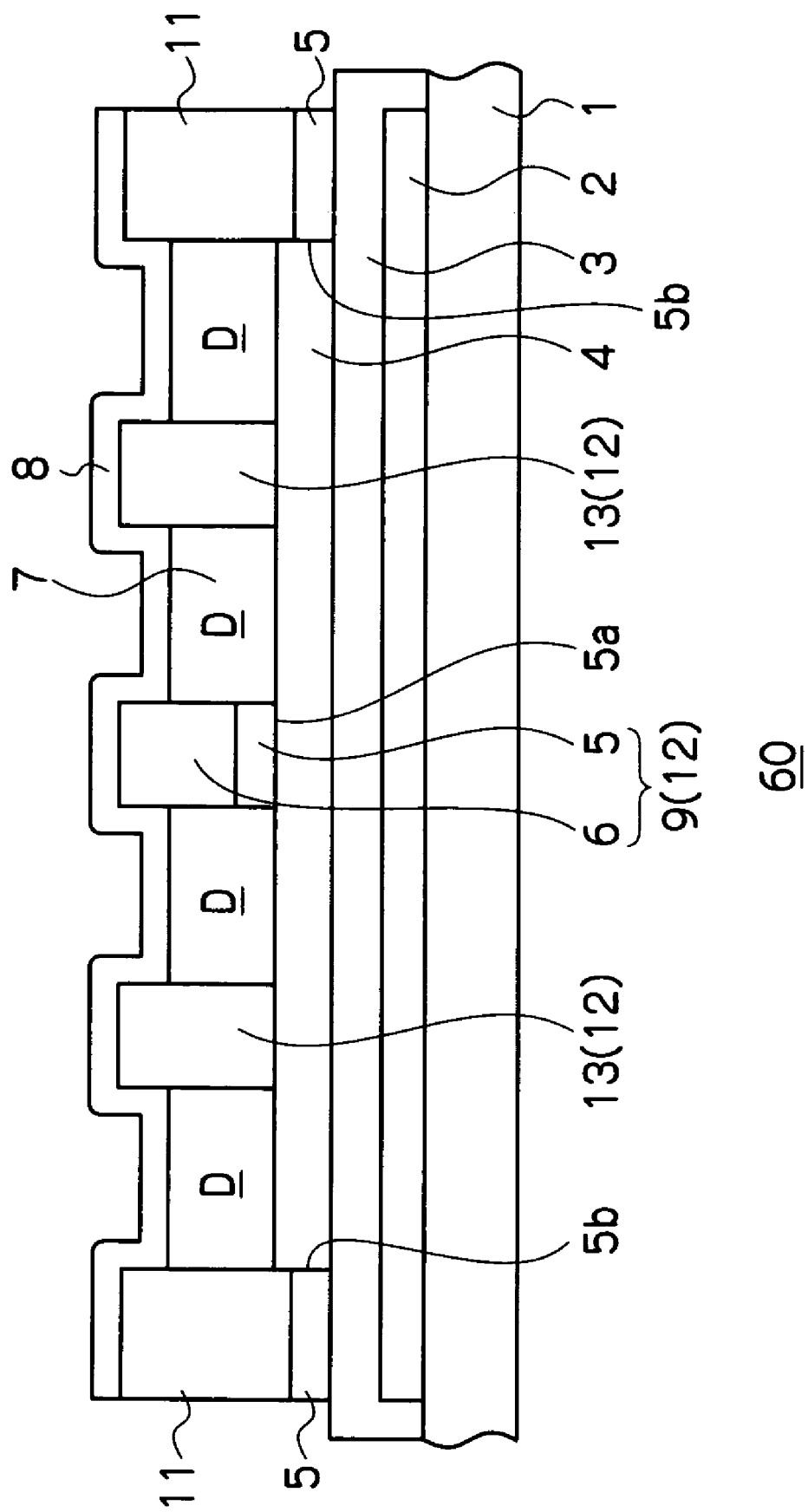
FIG. 7 illustrates a schematic cross-sectional view of another embodiment of the organic light-emitting element of the present invention.

An organic light-emitting element 60 shown in FIG. 7 has a partition configuration in which the first electrode 5 is provided to every other partition including the first partitions 11. The other configuration is the same as the one shown in FIG. 6 and the same reference numbers are used to refer to the same components and their explanation is omitted. In this configuration, the charge from the first electrode 5 provided to the first partition 11 is injected into the charge injection layer 4 from the end 5b. Therefore, the quantity of such charge is different from that of the charge from the second partition 12 that is injected into the charge injection layer 4 from the bottom surface 5a. Therefore, it is preferable in this partition configuration that the area of the end 5b that is defined by the thickness of the first electrode 5 provided to the first partition 11 and the area of the bottom surface 5a of the first electrode 5 provided to the second partition 12 are adjusted on an arbitrary basis.

The organic light-emitting element of the present invention is described above using the organic light-emitting elements shown in FIGS. 1 to 7 by way of example. However, the organic light-emitting element of the present invention can be modified in various manners within their characteristics. For example, the first partition 11 can be provided on the first insulating layer 3, on the auxiliary electrode 2, or on the base 1. Furthermore, the first partition 11 can have the first electrode 5. The second partition 12 can all be configured by the laminated body 9 or can be configured by the laminated body 9 and insulating structure 13 on an arbitrary basis. Furthermore, the second partition 12 can be formed on the charge injection layer 4 or on the first insulating layer 3. When configured by the insulating structure 13, the second partition 12 can be provided on the auxiliary electrode 2 or on the base 1.

Here, an organic transistor element and an organic EL element will be described. In the above configuration, an organic transistor element can be configured by replacing the organic light-emitting layer 7 with an organic semiconductor layer. In other words, referring to FIG. 1 for explanation, the organic transistor element of the present invention (not shown) has a large number of unit elements each at least composed of a base 1, an auxiliary electrode 2 provided on the base 1, a first insulating layer 3 provided so as to cover at least the auxiliary electrode 2, a charge injection layer 4 provided on the first insulating layer 3, laminated bodies 9 each consisting of a first electrode 5 and a second electrode 6 and provided on the first insulating layer 3 or on the charge injection layer 4 in a predetermined pattern, an organic semiconductor layer formed by coating on the charge injection layer 4 in regions where the laminated bodies 9 are not provided (the same configuration as the organic light-emitting layer 7 in FIG. 1), and a second electrode 8 provided so as to cover at least the organic semiconductor layer. In this organic transistor element, the unit element has first partitions 11 provided to demarcate the organic semiconductor layer from other adjacent unit elements and at least one or more second partitions 12 provided between the first partitions 11 and demarcating the organic semiconductor layer so as to have a uniform coated thickness, and one of the first partition 11 and second partition 12 is the laminated body 9. Furthermore, some of the plurality of second partitions 12 can be configured by the insulating structures 13 provided in a predetermined pattern. Here, the detailed configuration is the same as that of the organic light-emitting element described with reference to FIGS. 1 to 7 and the explanation is omitted.

With the above organic transistor element, for example, when the second partitions 12 are positioned in consideration of the ink-jet discharging rate, a fixed amount of ink for forming the organic semiconductor layer can be coated on the charge injection layer 4 between the first partition 11 and the second partition 12 or between the second partitions 12, 12. Consequently, the organic semiconductor layer formed by coating has the same thickness and then can yield uniform characteristics such as a carrier moving speed in the unit element configuring the organic transistor element.

Figure 8:
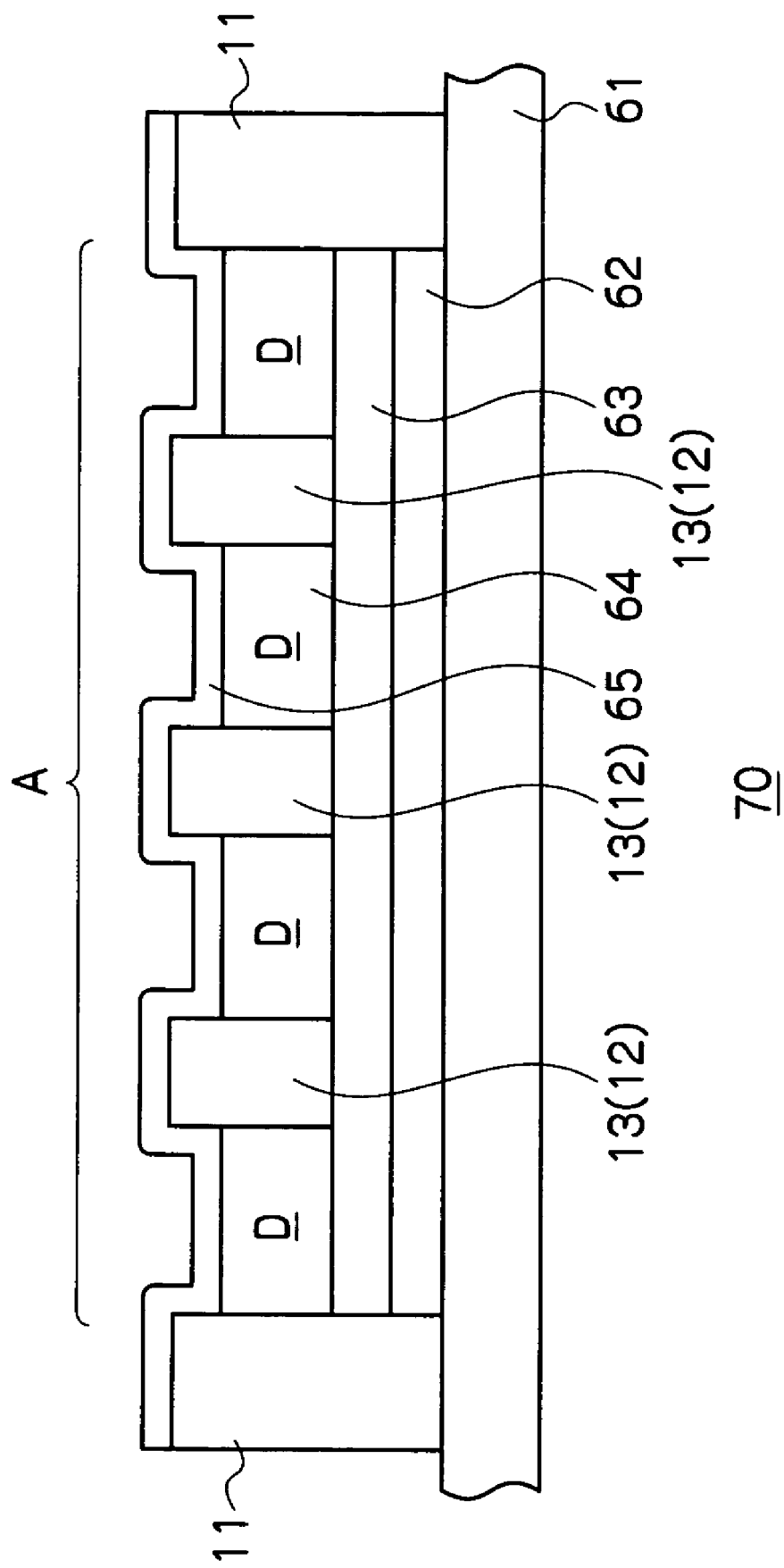
FIG. 8 illustrates a schematic cross-sectional view of an embodiment of the organic EL element of the present invention.

Both the above organic light-emitting transistor element and the organic transistor element have an element structure having a transistor structure but can be an organic EL element having a diode structure. FIG. 8 illustrates a schematic cross-sectional view of an embodiment of the organic EL element of the present invention. An organic EL element of the present invention 70 has, as shown in FIG. 8, a large number of unit pixels A each at least composed of a base 61, an A-electrode 62 provided on the base 61, a charge injection layer 63 provided so as to cover at least the A-electrode 62, insulating structures 13 provided on the A-electrode 62 or on the charge injection layer 63 in a predetermined pattern, an organic light-emitting layer 64 formed by coating on the charge injection layer 63 in regions where the insulating structures 13 are not provided, and a B-electrode 65 provided so as to cover at least the organic light-emitting layer 64. The unit pixel A has first partitions 11 provided to demarcate the organic light-emitting layer from other adjacent unit elements and at least one or more second partitions 12 provided between the first partitions 11 and demarcating the organic light-emitting layer so as to have a uniform coated thickness, and the second partitions 12 are configured by the insulating bodies 13. Here, the detailed configuration is the same as that of the organic light-emitting element described with reference to FIGS. 1 to 7 and the explanation is omitted.

In the organic EL element 70, for example, with the second partitions 12 being positioned in consideration of the ink-jet discharging rate which is used, a fixed amount of ink for forming the organic light-emitting layer can be coated on the charge injection layer 63 between the first partition 11 and the second partition 12 or between the second partitions 12, 12. Consequently, the organic light-emitting layer 64 formed by coating has the same thickness and then can yield an even luminescence in the unit pixel configuring the organic EL element 70 and further yield an even light emission over the entire organic EL panel. In a preferable embodiment of the organic EL element 70, the charge injection layer 63 can be a layer formed by coating.

(Planar partition configuration) The planar configuration of a unit pixel that is configured by the first partitions 11 and the second partitions 12 will be described hereafter with reference to FIGS. 9 to 19.

FIG. 9 illustrates a plan view of a partition configuration configured by the first and second partitions. In this partition configuration, the first partitions 11 and the second partitions 12 are arranged in the form of a lattice. In this lattice-like partition configuration, the coating regions D formed in a unit pixel A have the same volume. With the same amount of ink for forming the organic light-emitting layer being introduced in the coating regions D by coating, the organic light-emitting layer 7 in the coating regions D has the same thickness T.

Figure 10:
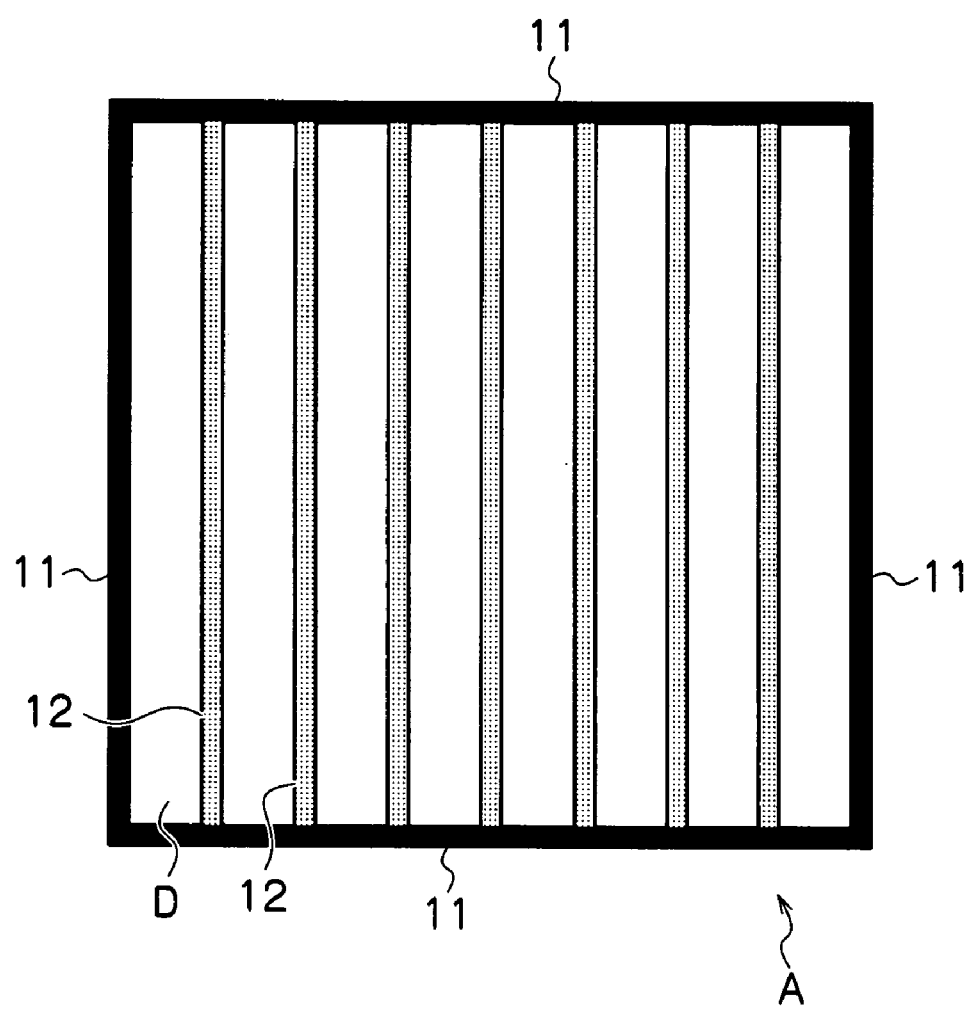
FIG. 10 illustrates a plan view of another partition configuration relating to the present invention.

FIG. 10 illustrates a plan view of another partition configuration configured by the first and second partitions. In this partition configuration, the second partitions 12 are arranged in the form of a vertical blind between the opposed first partitions 11. The coating regions D configured by the first partitions 11 and second partitions 12 to hold the organic light-emitting layer 7 are arranged in the form of a vertical blind and have the same volume. The second partitions 12 are not connected to each other but rather are apart from each other. In this configuration, the second partitions 12 do not create any closed space by themselves. They create the coating regions D in the form of a vertical blind. For example, sequentially discharging in the coating regions D while moving the ink-jet nozzle at a fixed pitch or at a fixed speed in the longitudinal direction of the coating regions, the organic light-emitting layer 7 formed in the coating regions D has the same thickness T in any part. When the transfer method is used, a printing matrix is formed in a pattern corresponding to the partition configuration and the ink for forming the organic light-emitting layer is applied to the printing matrix and transferred. In this way, the organic light-emitting layer 7 in each coating region D has a uniform thickness and the same thickness as those in the other coating regions D. In FIG. 10, the second partitions 12 are linearly arranged in the form of a vertical blind. However, the second partitions 12 can be arranged in other configurations, such as a zigzag pattern or a curved sine-wave pattern, connecting the opposed first partitions 11.

Figure 11:
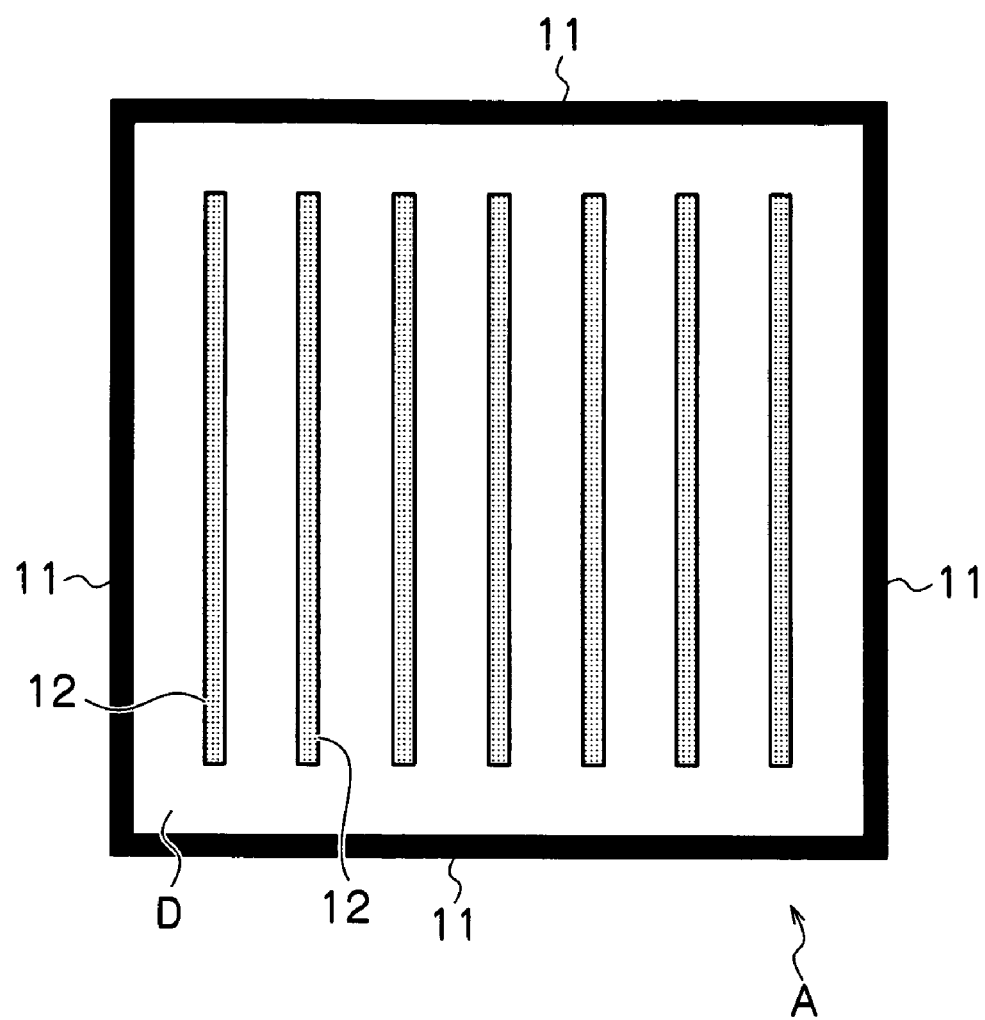
FIG. 11 illustrates a plan view of another partition configuration relating to the present invention.

FIG. 11 illustrates a plan view of another partition configuration configured by the first and second partitions. In this partition configuration, the first partitions 11 define the four sides of a unit pixel A and the second partitions 12 are arranged apart from the first partitions 11, not connected to them. In this configuration, the first partitions 11 and second partitions 12 create no closed space within a unit pixel A. Therefore, for example, a continuous ink-jet discharge operation is available, providing an organic light-emitting element with high productivity. More specifically, the second partitions 12 vertically running in the plan view of FIG. 1 are juxtaposed in the transversal direction without connection to the first partitions 11 at the top and bottom ends. In this partition configuration, no small coating regions D are formed in the unit pixel A. However, sequentially discharging in the coating region D while moving the ink-jet nozzle at a fixed pitch or at a fixed speed in the longitudinal direction of the coating region, the organic light-emitting layer 7 has the same thickness T in any part. When the transfer method is used, a printing matrix is formed in a pattern corresponding to the partition configuration and the ink for forming the organic light-emitting layer is applied to the printing matrix and transferred. In this way, the organic light-emitting layer 7 in each coating region D has a uniform thickness and the same thickness as those in the other coating regions D. Not forming any closed space leads to a reduction in the area occupied by the partitions even though the reduction is small. This advantageously increases the opening rate compared with the embodiment shown in FIG. 10. Also in FIG. 11, the parted second partitions 12 are linearly arranged. However, the second partitions 12 can be arranged in other patterns such as a zigzag pattern or a curved sine-wave pattern.

Figure 12:
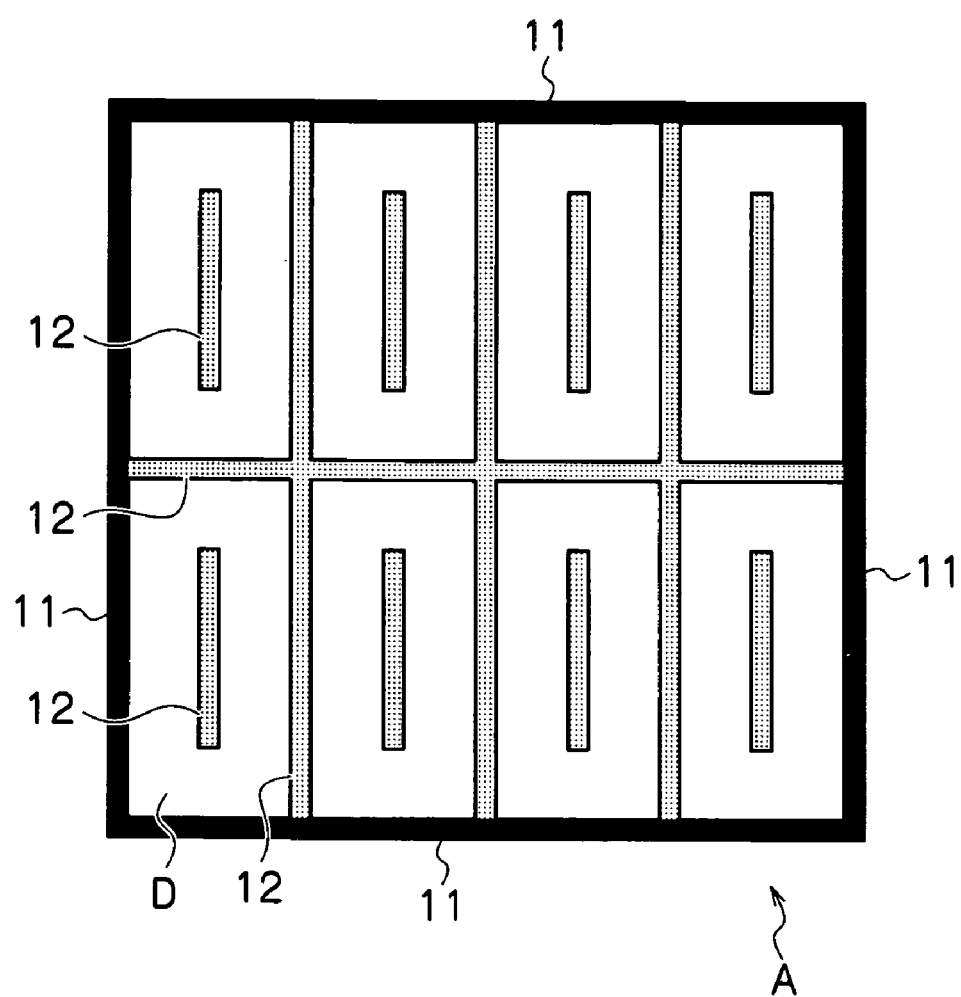
FIG. 12 illustrates a plan view of another partition configuration relating to the present invention.

FIG. 12 illustrates a plan view of another partition configuration configured by the first and second partitions. In this partition configuration, the first partitions 11 define the four sides of a unit pixel A and some of the second partitions 12 are arranged apart from the first partitions 11 and the second partitions 12, not connected to them. More specifically, the coating regions D of a certain size are configured by the second partitions 12 in the form of a lattice in the unit pixel A defined by the first partitions 11. Then, the second partitions 12 are further provided in each coating region D without connecting to the first partitions 11 and the second partitions 12. In this configuration, for example, a continuous ink-jet discharge operation is available in each coating region D configured by the first partitions 11 and the second partitions 12, providing an organic light-emitting element with high productivity. Furthermore, the transfer method can apply in the same manner as described above.

FIG. 13 illustrates a plan view of another partition configuration configured by the first and second partitions. In this partition configuration, the first partitions 11 and the second partitions 12 are configured in a honeycomb pattern (or in a form of a honeycomb). In this honeycomb partition configuration, the coating regions D formed in a unit pixel A have the same volume. With the same amount of ink for forming the organic light-emitting layer being introduced in the coating regions D by coating, the organic light-emitting layer 7 in the coating regions D has the same thickness T.

Figure 14:
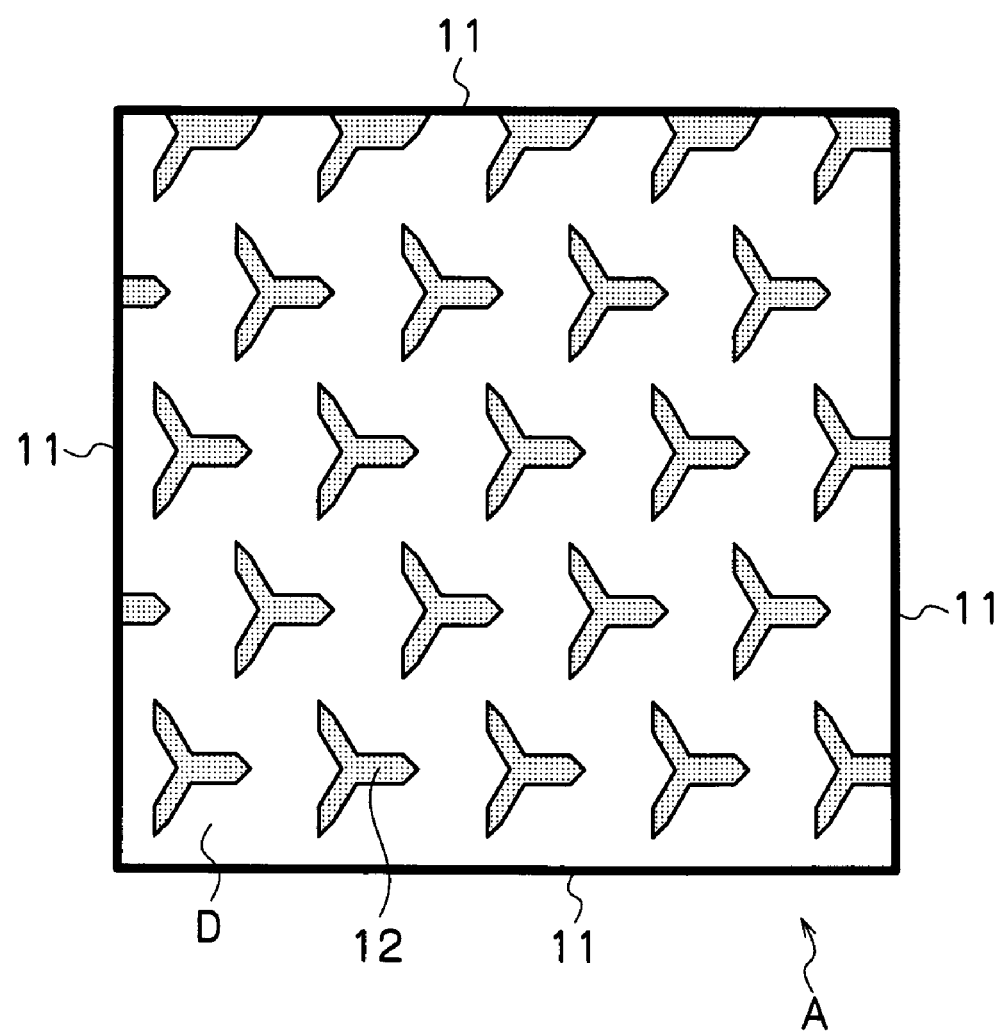
FIG. 14 illustrates a plan view of another partition configuration relating to the present invention.

FIG. 14 illustrates a plan view of another partition configuration configured by the first and second partitions. This partition configuration is a modification of the honeycomb partition configuration of FIG. 13. The second partitions 12 constituting the honeycomb pattern in FIG. 13 are partly removed to leave columnar bodies radially arranged away from each other at 120 degree intervals. In this configuration, the second partitions 12 form a regularly continued coating region D without creating any closed spaces. For example, sequentially discharging in the coating region D while moving the ink-jet nozzle at a fixed pitch or at a fixed speed in the longitudinal direction of the coating region, the organic light-emitting layer 7 formed in the coating region D has the same thickness T in any part. Furthermore, the transfer method can apply in the same manner as described above.

FIG. 15 illustrates a plan view of another partition configuration configured by the first and second partitions. In this partition configuration, the first partitions 11 and the second partitions 12 configure circular coating regions D. In this partition configuration, the circular coating regions D formed within a unit pixel A have the same volume. With the same amount of ink for forming the organic light-emitting layer being introduced in the coating regions D by coating, the organic light-emitting layer 7 in the coating regions D has the same thickness T.

Figure 16:
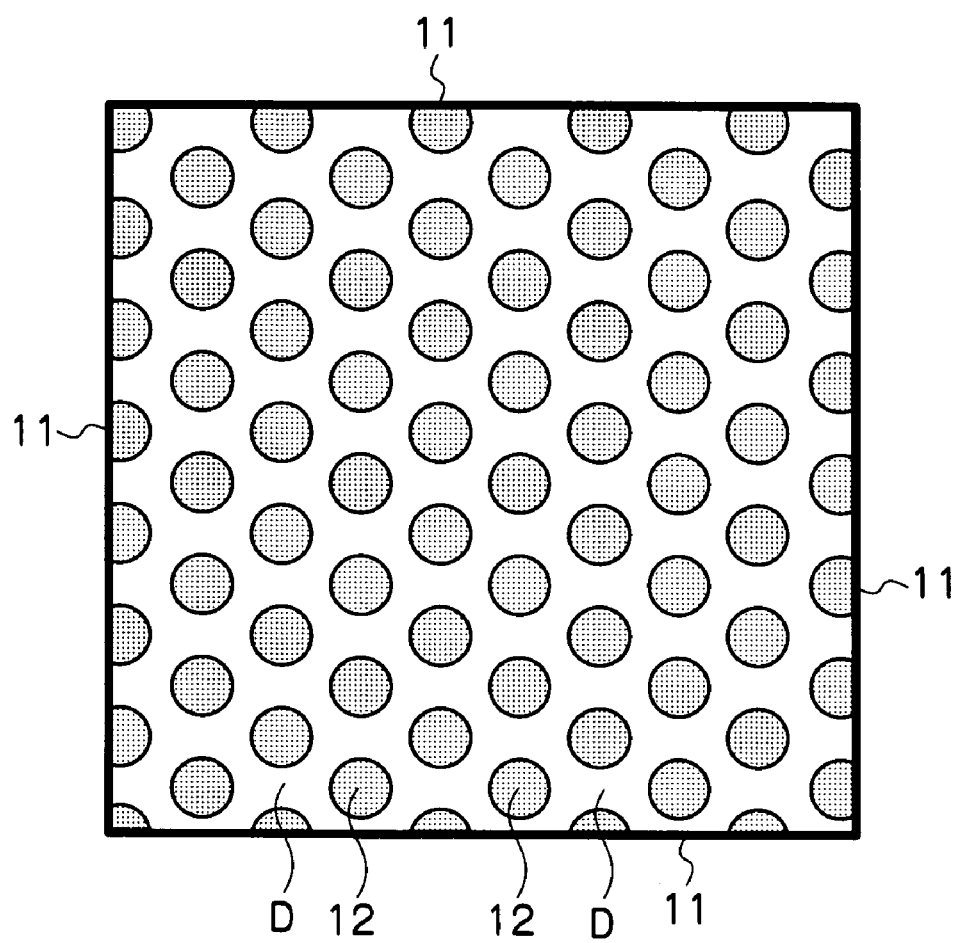
FIG. 16 illustrates a plan view of another partition configuration relating to the present invention.

FIG. 16 illustrates a plan view of another partition configuration configured by the first and second partitions. This partition configuration is a reversed version of the configuration shown in FIG. 15. More specifically, the coating regions D in FIG. 15 are replaced with the second partitions 12 and the second partitions 12 in FIG. 15 are replaced with the coating regions D. In this partition configuration, the second partitions 12 form a regularly continued coating region D without creating any closed space. For example, sequentially discharging in the coating region D while moving the ink-jet nozzle at a fixed pitch or at a fixed speed in the longitudinal direction of the coating region, the organic light-emitting layer 7 formed in the coating region D has the same thickness T in any part. Furthermore, the transfer method can apply in the same manner as described above.

Figure 17:
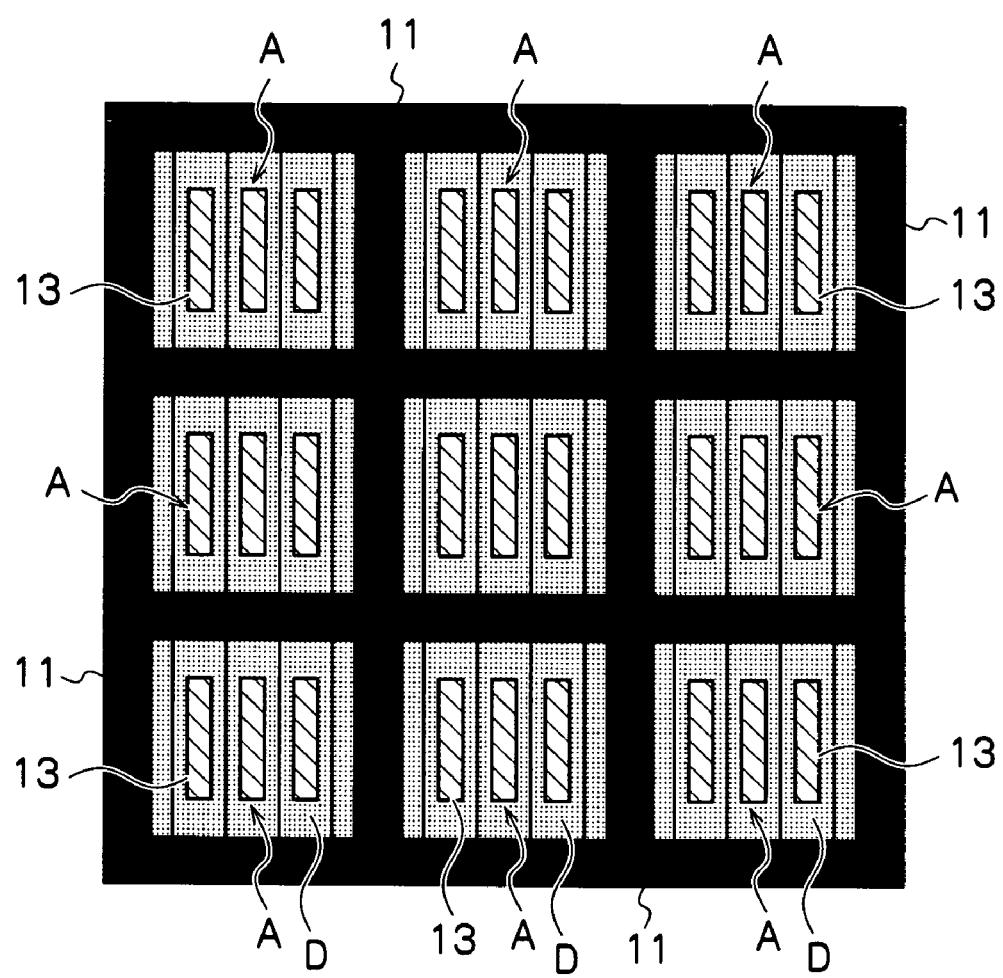
FIG. 17 illustrates a plan view of another partition configuration relating to the present invention.
Figure 18:
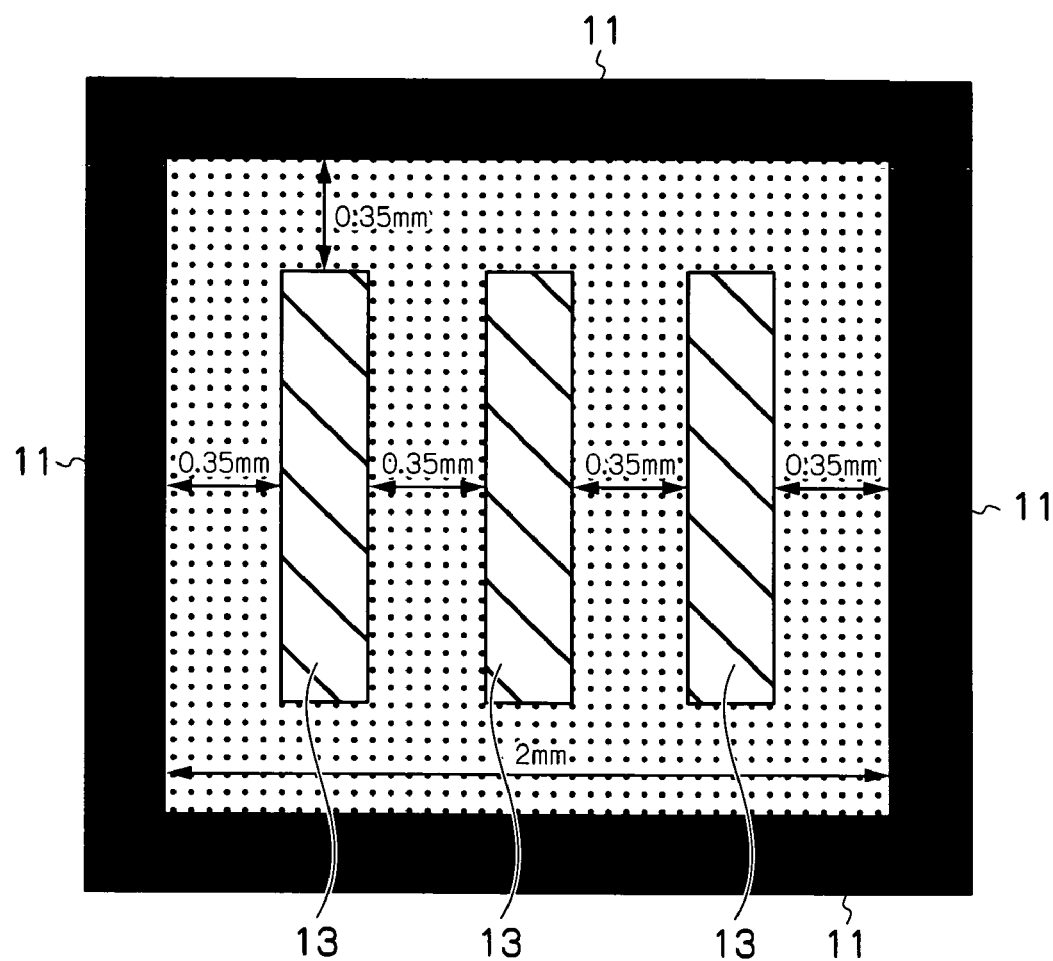
FIG. 18 is an illustration for explaining the partition configuration shown in FIG. 17.
Figure 19:
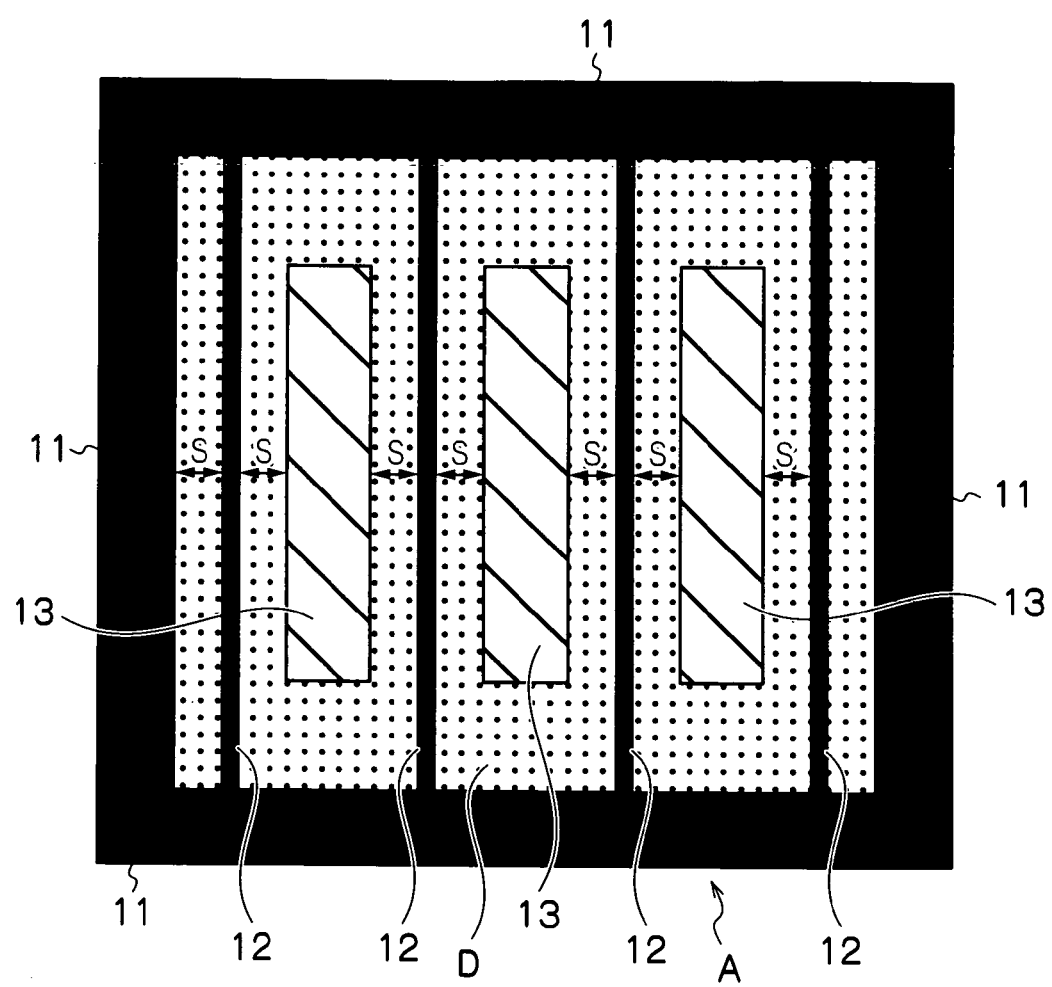
FIG. 19 is an illustration for explaining the partition configuration shown in FIG. 17.

FIG. 17 illustrates a plan view of another partition configuration configured by the first and second partitions. FIGS. 18 and 19 are illustrations for explaining the partition configuration shown in FIG. 17. In this partition configuration, nine 3×3 unit pixels A are shown. In each unit pixel A, the second partitions 12 are linearly arranged between the opposed first partitions 11 as shown in FIG. 10. Then, insulating structures 13 are provided between the second partitions 12, 12 along them apart from the first partitions 11 and the second partitions 12.

The above partition configuration will be further described using an embodiment. Here, the process of creating the partition configuration shown in FIG. 17 is focused on, and the order of formation of the other components (such as the second insulating layer 3 and the charge injection layer 4) is omitted. First, the first partitions 11 are formed in the shape of a 2 mm×2 mm square. Then, as shown in FIG. 18, the insulating structures 13 are formed for example at a distance of 0.35 mm from the first partitions 11 and for example at intervals of 0.35 mm. Then, the laminated bodies 9 with the first electrode 5 are formed in the manner that they are at a given distance S from the adjacent first partitions 11 and insulating structures 13. In this way, regularly continued coating regions D are formed. Then, for example, sequentially discharging in the coating regions D while moving the ink-jet nozzle at a fixed pitch or at a fixed speed in the longitudinal direction of the coating regions, the organic light-emitting layer 7 formed in the coating regions D has the same thickness T in any part. In the process of creating the partition configuration shown in FIGS. 17 to 19, when the charge injection layer 4 is formed by coating, the charge injection layer 4 can be formed by coating after the first partitions 11 are formed or after the insulation structures 13 are formed. The organic light-emitting layer 7 is formed by coating after the laminated bodies 9 are formed.

The above described partition configuration is not confined to those shown in FIGS. 9 to 19. For example, the coating regions D can have a rectangular, an oval, or another shape. The above described partition configurations are particularly preferable for large panels, such as sign displays, having a unit pixel A of 0.25 mm$^2$ or larger in size. Here, the unit pixel of 0.25 mm$^2$ or larger in size can preferably have a square, a rectangular, or other polygonal shape, or a circular, an oval, or another shape.

The physical property of the partitions will be described hereafter. The first partition 11 and the second partition 12 used in the present invention are not particularly restricted in surface energy and can have ink-affinity surfaces or ink-repellent (or ink-rejecting) surfaces. If one or both of the first partition 11 and the second partition 12 have ink-affinity wall surfaces, the ink for forming the organic light-emitting layer easily extends along the partition surface, assisting the organic light-emitting layer 7 to have a uniform thickness. On the other hand, if one or both of the first partition 11 and second partition 12 have ink-repellent wall surfaces, the ink for forming the organic light-emitting layer does not extend beyond the top surfaces of the partitions, yielding the following advantages: (1) the partitions do not need to be high compared with non-ink-repellent partitions (in other words, the partitions slightly higher than the organic light-emitting layer 7 serve well), and (2) even the partitions having a height smaller than the coated thickness resulting from dropped ink prevent the ink for forming the organic light-emitting layer from extending beyond the top surfaces of the partitions. In any case, this invention advantageously allows the organic light-emitting layer in a unit pixel to have a given thickness.

In the present invention, it is preferable that both the first partition 11 and the second partition 12 are ink-repellent so that the ink for forming the organic light-emitting layer does not extend beyond the partitions. Consequently, the above effects (1) and (2) are obtained and the organic light-emitting layer in a unit pixel advantageously has a given thickness.

The partitions having ink-affinity wall surfaces can be obtained for example by plasma or ultra-violet (UV) surface treatment or by containing an ink-affinity material in the partition. On the other hand, the partitions having ink-repellent wall surfaces can also be obtained for example by plasma or UV surface treatment or by containing an ink-repellent material in the partition.

The partitions 11 and/or the partitions 12 can be transparent or colored. For example, the partition surface oriented in the light emission direction can be black; the partition has a black top surface in the top emission type and has a black bottom surface in the bottom emission type. The entire partition can also be black. Such partitions serve as the black matrix for a color filter and sharpen the image.

When the partitions are transparent or translucent, they can transmit emitted light. The partitions serve to equalize the thickness of the organic light-emitting layer 7 and advantageously prevent substantial reduction of the opening rate. Particularly, if an optical material having a predetermined refractive index to refract/transmit the light produced in the organic light-emitting layer 7 so as to exit from the display surface is used, the formation of the second partitions advantageously does not result in reducing the light-emitting area.

In the above case, the positional relationship between the top surface of the second partitions 12 and the top surface of the organic light-emitting layer 7 is not particularly restricted. Generally, the top surface of the second partitions 12 is at a higher level than the top surface of the organic light-emitting layer 7. In such a configuration, the ink for forming the organic light-emitting layer coated on the charge injection layer 4 does not flow in the adjacent coating regions over the second partitions 12. Then, the organic light-emitting layer 7 formed in the unit pixel A has a uniform thickness T in any part and does not cause any uneven light emission. Generally, it is preferable that the gap between the top surface of the second partitions 12 and the top surface of the organic light-emitting layer is 50 nm or larger.

Particularly when both the first partition 11 and the second partition 12 are ink-repellent, it is preferable that the top surfaces of the first partition 11 and the second partition 12 are at a level equal to or at least 50 nm higher than the top surface of the organic light-emitting layer 7. In this way, the ink for forming the organic light-emitting layer does not flow in the adjacent unit pixels A or the coating regions D over the partitions. In consideration of forming the second electrode 8, it is preferable that the gap between the top surface of the partitions and the top surface of the organic light-emitting layer is 20 μm or smaller.

In the organic light-emitting element of the present invention having the above described partition configurations, the thickness T of the organic light-emitting layer 7 formed by coating in a unit pixel A preferably has a deviation from the average thickness of ±10% or smaller and particularly preferably ±5% or smaller in any part. When the deviation is larger than ±10%, an uneven light emission within a unit pixel A or an uneven light emission between adjacent unit pixels can be recognized.

As described above, according to the organic light-emitting element of the present invention, the unit pixels A constituting the organic light-emitting element each have first partitions 11 provided to demarcate the organic light-emitting layer 7 from other adjacent unit pixels and at least one or more second partitions 12 provided between the first partitions 11 and demarcating the organic light-emitting layer 7 so as to have a uniform coated thickness T. Then, for example, with the second partitions 12 being positioned in consideration of the ink-jet discharging rate which is used, a fixed amount of ink for forming the organic light-emitting layer can be coated (including application by transfer) on the charge injection layer 4 between the first partition 11 and second partition 12 or between the second partitions 12, 12. Consequently, the organic light-emitting layer 7 formed by coating has the same thickness T and, then, can yield an even luminescence within a unit pixel A and field an even light emission over the entire panel. Furthermore, according to the organic light-emitting element of the present invention, at least one of the first partition 11 and the second partition 12 is a laminated body 9 consisted of a first electrode 5 and a second electrode 6 and provided in a predetermined pattern. Therefore, the charge from the first electrode 5 can be injected into the organic light-emitting layer 7 provided between the first partition 11 and the second partition 12 or between the second partitions 12, 12. In such an organic light-emitting element of the present invention, the organic light-emitting layer 7 formed by coating has the same thickness T and the current flow between the first electrode 5 and second electrode 8 can be controlled, whereby the light emission quantity can be controlled without any uneven light emission within a unit pixel A. Consequently, a large light-emitting panel having a controllable light emission quantity and an even light emission can be provided.

The same effect can be obtained by an organic transistor element having the same configuration or an organic EL element having the configuration shown in FIG. 8.

The components other than the partitions will be described in detail hereafter.

(Base) The base 1 is not particularly restricted and can be selected according to the materials of layers formed thereon. The base 1 can be made of various materials including metals such as Al, glass, quartz, or resin. When the organic light-emitting element has a bottom emission structure in which light emerges from the base side, the base is preferably made of a transparent or translucent material. When the organic light-emitting element has a top emission structure in which light emerges from the second electrode 8 side, the base does not need to be transparent or translucent and can be made of an opaque material.

Particularly preferably, various materials generally used as the base of organic EL elements can be used. For example, flexible materials or hard materials are selected according to the application. More specifically, for example, the base can be made of glass, quartz, polyethylene, polypropylene, polyethylene terephthalate, polymethacrylate, polymethyl methacrylate, polymethyl acrylate, polyester, or polycarbonate. The base 1 can have a sheet form or a continuous form, more specifically a card, film, disk, or chip form.

The base 61 of the organic EL element having the configuration shown in FIG. 8 corresponds to the aforementioned base 1 and the aforementioned various technical contents are applicable.

(Electrodes) The electrodes constituting the present invention are the auxiliary electrode 2, first electrode 5, and second electrode 8. These electrodes can be made of materials such as metals, conductive oxides, and conductive polymers.

The first electrode 5 is provided on the first insulating layer 3 in a predetermined pattern. The predetermined pattern is not particularly restricted. Examples of the first electrode 5 include a comb-shaped electrode having a line width of approximately 1 µm to 500 µm and a line pitch of approximately 1 µm to 500 µm and a lattice-shaped electrode having a lattice width of approximately 1 to 500 µm a lattice pitch of approximately 1 µm to 500 µm. The first electrode 5 is not confined to being comb-shaped or lattice shaped and can have other shapes such as a rhombic or circular shape. The line width and pitch are not particularly restricted and they do not need to be equal. The thickness T1 of the first electrode 5 varies depending on the configuration of the charge injection layer 4. For example, when the first electrode 5 is provided on the charge injection layer 4 as shown in FIG. 1, the charge mainly emerges at the bottom surface of the first electrode 5; therefore, its thickness is not particularly restricted and, for example, can be approximately 10 nm to 200 nm. On the other hand, for example, when the charge injection layer 4 is provided between the first electrodes as shown in FIG. 5, the charge mainly emerges at the ends of the first electrode 5. Then, the first electrode 5 has to have a minimum thickness to inject the charge into the charge injection layer 4 and, for example, preferably has a thickness of approximately 10 nm to 500 nm.

The auxiliary electrode 2 can be made of a transparent conductive film of, for example, ITO (indium tin oxide), indium oxide, IZO (indium zinc oxide), $SnO_2$, and ZnO; a metal having a large work function such as gold and chromium; a general metal such as Al and Ag; or a conductive polymer such as polyaniline, polyacetylene, polyalkyl thiophene derivatives, and polysilane derivatives. The auxiliary electrode 2 is provided on the base 1. A barrier layer or a smoothing layer can be provided between the base 1 and the auxiliary electrode 2.

When it is a negative electrode, the first electrode 5 or the second electrode 8 can be made of a metal having a small work function including elemental metals such as aluminum and silver; magnesium alloys such as MgAg; aluminum alloys such as AlLi, AlCa, and AlMg; alkali metals such as Li and Ca; and alkali metal alloys such as LiF.

When it is a positive electrode, the first electrode 5 or the second electrode 8 can be made of a metal making ohmic contact with the material of the organic layer (the charge injection layer or light-emitting layer) that is in contact with this positive electrode, including the electrode materials used for the auxiliary electrode 2 or for the above negative electrode. Preferably, metal materials having a large work function such as gold and chromium; a transparent conductive film of, for example, ITO (indium tin oxide), indium oxide, IZO (indium zinc oxide), $SnO_2$, and ZnO; and conductive polymers such as polyaniline, polyacetylene, polyalkyl thiophene derivatives, and polysilane derivatives can be used.

The auxiliary electrode 2, the first electrode 5, and the second electrode 8 can be a monolayer electrode made of the above electrode materials or a multilayer electrode made of a plurality of electrode materials. As described later, when the second insulating layer 6 is made of a photosensitive material removable by light irradiation, it is preferable that the first electrode 5 is made of a material that does not transmit the photosensitive material and the auxiliary electrode 2 is made of a material that transmits the exposure wavelength to the photosensitive material. The thicknesses of these electrodes are not particularly restricted and generally range from 10 nm to 1000 nm.

When the organic light-emitting element has a bottom emission structure, the electrode positioned below the organic light-emitting layer 7 is preferably transparent or translucent. When the organic light-emitting element has a top emission structure, the electrode positioned above the organic light-emitting layer 7 is preferably transparent or translucent. The transparent material can be the aforementioned transparent conductive films, metal films, or conductive polymer films. Here, the terms "below" and "above" are used with regard to the vertical direction in the plan views of the configurations in the drawings of the present invention.

The above electrodes are each formed by vacuum processing such as vacuum deposition, sputtering, and chemical vapor deposition (CVD), or by application. Their thicknesses vary depending on the materials used and, for example, preferably range approximately from 10 nm to 1000 nm. When any electrode film is formed on an organic layer such as the organic light-emitting layer 7 and the charge injection layer 4, a protective layer (not shown) can be provided on the organic layer so as to reduce the damage on the organic layer during the electrode film formation. The protective layer is provided before the electrode film is formed on the organic layer for example by sputtering. Preferably, the protective layer can be a deposited or sputtered film that is formed to a thickness of approximately 1 to 500 nm and causes very little damage during the film formation, such as a translucent film of Au, Ag, or Al and inorganic semiconductor film of ZnS or ZnSe.

The A-electrode 62 and the B-electrode 65 of the organic EL element having the configuration shown in FIG. 8 correspond to the aforementioned first electrode 5 and second electrode 8, respectively, and the aforementioned various technical contents are applicable.

(First insulating layer) The first insulating layer 3 is provided on the auxiliary electrode 2 and can be made of an inorganic material such as $SiO_2$, $SiN_x$, and $Al_2O_3$; an organic material such as polychloropylene, polyethylene terephthalate, polyoxymethylene, polyvinyl chloride, polyvinylidene fluoride, cyanoethyl pullulan, polymethyl methacrylate, polyvinylphenol, polysulfone, polycarbonate, and polyimide; or a commercially available conventional resist material. The first insulating layer 3 can be a monolayer-structured insulating layer formed by the above materials or a multi-player-structured insulating layer formed by a plurality of materials. As described later, when the second insulating layer 6 is made of a photosensitive material removable by light irradiation, it is preferable that the first insulating layer 3 is made of a material that transmits the exposure wavelength to the photosensitive material.

Particularly, from the viewpoint of production cost and easiness of production, the present invention can preferably use conventional resist materials. Such resist materials can be formed into a predetermined pattern by screen printing, spin coating, casting, pulling, transferring, ink-jet, and photolithography. The first insulating layer 3 made of the above inorganic materials can be formed by an existing pattern processing such as CVD. It is more preferable that the first insulating layer 3 has a smaller thickness. However, if the thickness is excessively small, the current leakage between the auxiliary electrode 2 and the first electrode 5 is easily increased. Therefore, generally, the thickness preferably ranges approximately from 0.001 µm to 5.0 µm.

When the organic light-emitting element has a bottom emission structure, the first insulating layer 3 is positioned below the organic light-emitting layer 7 and, therefore, preferably transparent or translucent. When the organic light-emitting element has a top emission structure, the first insulating layer 3 does not need to be transparent or translucent.

(Second insulating layer) The second insulating layer 6 is provided on the first electrode 5 and serves as a charge emergence restraining layer for restraining the emergence of the charge (holes or electrons; the same applies hereafter) at the top surface of the first electrode 5 that faces the second electrode 8, then restraining the charge from emerging at the top surface of the first electrode 5 and proceeding to the second electrode 8. In the present invention, the second insulating layer 6 is provided on the top surface of the first electrode 5 that faces the second electrode 8. Therefore, the charge emerges at the bottom surface and/or edges of the first electrode 5 where the second insulating layer 6 is not provided. The quantity of the charge emerging at the bottom surface and edges of the first electrode 5 is controlled by the gate voltage $V_G$ applied between the auxiliary electrode 2 and first electrode 5. The emerging charge proceeds to the second electrode 8 because of the drain voltage $V_D$ applied between the first electrode 5 and the second electrode 8. In the present invention, with the gate voltage $V_G$ applied between the auxiliary electrode 2 and the first electrode 5 being controlled, the current flow between the first and second electrodes can be controlled so as to control the light emission quantity.

The second insulating layer 6 can be made of various materials as long as it yields the above effect. The second insulating layer 6 can be an inorganic or organic insulating film, which is made of an inorganic insulating material such as $SiO_2$, $SiN_x$, and $Al_2O_3$, or a conventional organic insulating material such as polychloroprene, polyethylene terephthalate, polyoxy methylene, polyvinyl chloride, polyvinylidene fluoride, cyanoethyl pullulan, polymethyl methacrylate, polyvinyl phenol, polysulfone, polycarbonate, and polyimide. Furthermore, the second insulating layer 6 can be a monolayer-structured charge injection restraining layer formed by the above materials or a laminated-structured charge injection restraining layer formed by a plurality of materials. The second insulating layer 6 is formed by vacuum processing such as vacuum deposition, sputtering, and CVD, or by application. The thickness of the second insulating layer 6 varies depending on the material used and, for example, preferably ranges approximately from 0.001 μm to 10 μm.

The second insulating layer 6 can be, for example, a film made of a photosensitive material removable by light irradiation and more specifically can be a positive type resist film. When the second insulating layer 6 is made of a positive type photosensitive material, the photosensitive material is provided on the first insulating layer 3 to cover the light-shielding first electrode 5 and exposed to light from the base 1 side, whereby only the positive type photosensitive material provided between the first electrodes 5 can easily and accurately be removed. Consequently, the second insulating layer 6 can accurately be formed on the first electrode 5 in the same size as the first electrode 5 in a plan view.

The second insulating layer 6 is provided at least on the top surface of the first electrode 5 that faces the second electrode 8. Because of the second insulating layer 6 formed in this way, the charge does not emerge at the surface of the first electrode 5 that faces the second electrode 8 but emerges at the edges having a smaller area. Consequently, with the voltage applied between the auxiliary electrode 2 and the first electrode 5 (the gate voltage) being controlled, the quantity of the charge (quantity of the emerging holes) can be changed in a sensitive manner so as to control the current flow between the first and second electrodes for controlling the light emission quantity.

(Organic layer) In this application, the organic layer refers to the layers made of organic materials such as the organic light-emitting layer 7 and the charge injection layer 4. The organic layer is not particularly restricted as long as it additionally has a charge transporting layer where necessary or it contains charge injection substances. Besides the laminated configuration consisting of the charge injection layer 4 and organic light-emitting layer 7 shown in FIG. 1, examples of the organic layer include those additionally having a charge transporting layer or containing charge transport materials. More specifically, the organic layer can consist of, from the positive electrode side, a hole injection layer, a hole transporting layer, an organic light-emitting layer, an electron transporting layer, and an electron injection layer. Furthermore, any of these layers can be omitted where necessary. These layers configuring the organic layer are each formed to a proper thickness (for example ranging from 0.1 nm to 1 μm) according to the element structure and types of component materials. When the layers configuring the organic layer are excessively thick, a high voltage should be applied to obtain a given optical output, which may reduce the light emission efficiency. When the layers are excessively thin, sufficient luminescence may not be obtained when the electric field is applied because of possible pinholes.

The material of the organic light-emitting layer 7 is not particularly restricted as long as they are generally used as the light-emitting layer of organic EL elements. Examples of such materials include dye light-emitting materials, metal complex light-emitting materials, and polymer light-emitting materials.

Examples of the dye light-emitting materials include cyclopentadiene derivatives, tetraphenylbutadiene derivatives, triphenylamine derivative, oxadiazole derivative, pirazoroquinoline derivatives, distyrylbenzene derivative, distyrylarylene derivatives, silole derivatives, thiophene ring compounds, pyridine ring compounds, perynone derivatives, perylene derivatives, oligothiophene derivatives, trifumaramine derivatives, oxadiazole dimmers, and pyrazoline dimmers. Examples of the metal complex light-emitting materials include metal complexes having Al, Zn, Be, or a rare-earth metal such as Tb, Eu, and Dy as the center metal and an oxadiazol, thiadiazole, phenylpyridine, phenylbenzimidazole, or quinoline structure as the ligand, such as alumiquinolinol complex, benzoquinolinol beryllium complex, benzoxazole zinc complex, benzothiazole zinc complex, azomethyl zinc complex, porphyrin zinc complex, and europium complex. Examples of the polymer light-emitting materials include polyparaphenylene vinylene derivatives, polythiophene derivatives, polyparaphenylene derivatives, polysilane derivatives, polyacethylene derivatives, polyvinylcalbazole, polyfluorenone derivatives, polyfluorene derivatives, polyquinoxaline derivatives, and their copolymers.

The organic light-emitting layer 7 can contain additives such as doping substances for improving the light emission efficiency and changing the light emission wavelength. Examples of the doping substances include perylene derivatives, coumarin derivatives, rubrene derivatives, quinacridone derivatives, squalium derivatives, porphyrin derivatives, styryl dye, tetracene derivatives, pirazoline derivatives, decacyclene, phenoxazone, quinoxaline derivatives, carbazole derivatives, and fluorene derivatives.

Examples of the material of the charge injection layer 4 include, in addition to the compounds listed as the light-emitting materials for the organic light-emitting layer 7, phenylamine compounds, starburst amine compounds, phthalocyanine compounds, polyacene compounds, oxides such as vanadium oxide, molybdenum oxide, ruthenium oxide, or aluminum oxide, amorphous carbon or derivatives such as polyaniline or polythiophene.

A charge injection layer for the second electrode 8 can be provided on the organic light-emitting layer 7 side of the second electrode 8. In addition to the compounds listed as the light-emitting materials for the organic light-emitting layer 7, when the second electrode 8 is a negative electrode, examples of the material for forming the charge (electrons) injection layer includes alkali metals, halides of alkali metals, or organic complexes of alkali metals, such as aluminum, lithium fluoride, strontium, magnesium oxide, magnesium fluoride, strontium fluoride, calcium fluoride, barium fluoride, aluminum oxide, strontium oxide, calcium, sodium polymethylmethacylate polystyrenesulfonate, lithium, cesium, or cesium fluoride.

The material for forming the charge (holes) transporting layer when the first electrode 5 is a positive electrode can be those generally used as a hole transport material, such as phthalocyanine, naphthalocyanine, porphyrin, oxadiazole, triphenylamine, triazole, imidazole, imidazoline, pyrazoline, tetrahydroimidazole, hydrazone, stilbene, pentacene, polythiophene, or butadiene, or their derivatives. Furthermore, commercially available materials for forming a charge transporting layer, such as poly(3,4)ethylenedioxythiophene/polystyrene sulfonate (PEDOT/PSS manufactured by Bayer as an aqueous solution under the trade name of Baytron P A14083), can also be used. The charge transporting layer is formed using a coating solution for forming the charge transporting layer containing the above compounds. The above charge transport materials can be mixed in the above described organic light-emitting layer 7 or in the above described charge injection layer 4.

Furthermore, a charge transporting layer can be provided on the second electrode 8 side of the organic light-emitting layer 7. The material for forming the charge (electrons) transporting layer when the second electrode 8 is a negative electrode can be those generally used as an electron transport material, such as anthraquinone methane, fluorenylidene methane, tetracyano ethylene, fluorenone, diphenoquinone-oxadiazole, anthrone, thiopyranedioxide, diphenoquinone, benzoquinone, malononitrile, niditrobenzene, nitroanthraquinone, maleic acid anhydride, or perylenetetracarboxylic acid, or their derivatives. The charge (electrons) transporting layer is formed using a coating solution for forming the charge transporting layer containing the above compounds. These charge transport materials can be mixed in the above described organic light-emitting layer 7 or in the above described electron injection layer.

The above described organic layer including the organic light-emitting layer 7 and charge injection layer 4 can contain light-emitting materials or charge transport materials consisting of oligomer materials or dendrimer materials where necessary. The layers configuring the organic layer are formed by vacuum deposition for forming a film, or by resolving or dispersing the materials in a solvent such as toluene, chloroform, dichloromethane, tetrahydrofuran, and dioxane to prepare a coating solution and applying or printing the coating solution using a coating device.

The charge injection layer 63 and organic light-emitting layer 64 of the organic EL element having the configuration shown in FIG. 8 correspond to the aforementioned charge injection layer 4 and organic light-emitting layer 7, respectively, and the aforementioned various technical contents are applicable.

(Method of producing the organic light-emitting element)
A method of producing the organic light-emitting element of the present invention will be described based on the configuration shown in FIG. 1. For producing the organic light-emitting element of the present invention 10 shown in FIG. 1, first, a base 1 on which an auxiliary electrode 2 is formed is prepared and a first insulating layer 3 is formed thereon. Then, the first partitions 11 demarcating a unit pixel A are formed on the first insulating layer 3 and, then, a charge injection layer 4 is formed in the demarcated area. Then, an insulating structure 13 is formed on the charge injection layer 4 in a predetermined pattern and then, first electrodes 5 are formed in a predetermined pattern and a second insulating layer 6 is formed on the first electrodes 5 in the same size as the first electrode 5 in a plan view so as to form laminated bodies 9. The laminated bodies 9 and the insulating structure 13 serve as the second partitions 12. An organic light-emitting layer 7 having a uniform thickness T is formed between the second partitions 12, 12 and between the second partition 12 and first partition 11. Then, a second electrode 8 is formed to cover the entire structure, whereby the organic light-emitting element 10 having the configuration shown in FIG. 1 is produced.

The organic light-emitting element of the present invention is not confined to the one produced by the above process and can be produced in other processes. When other layers are added, it is referable that the production method is modified in accordance with the properties of the layers on an arbitrary basis.

For the organic light-emitting element 20 having the first partitions 11 on the auxiliary electrode 3 as shown in FIG. 3, first, a base 1 on which an auxiliary electrode 2 is formed is prepared and the first partitions 11 demarcating a unit pixel A are formed on the auxiliary electrode 2. Then, a first insulating layer 3 and a charge injection layer 4 are sequentially formed in the demarcated area. Then, the insulating structure 13, the laminated bodies 9, an organic light-emitting layer 7, and a second electrode 8 are sequentially formed in the same manner as described above, whereby the organic light-emitting element 20 having the configuration shown in FIG. 3 is produced.

For the organic light-emitting element 30 having the first partitions 11 on the base 1 as shown in FIG. 4, first, a base 1 on which an auxiliary electrode 2 is formed is prepared, and then the auxiliary electrode 2 in regions where the first partitions 11 demarcating a unit pixel A are to be formed is removed. Then, the first partitions 11 are formed at predetermined positions and, then, a first insulating layer 3 and a charge injection layer 4 are sequentially formed in the demarcated area formed by the first partitions 11. Then, the insulating structure 13, the laminated bodies 9, an organic light-emitting layer 7, and second electrode 8 are sequentially formed in the same manner as described above, whereby the organic light-emitting element 30 having the configuration shown in FIG. 4 is produced.

For the organic light-emitting element 40 having the same partition configuration as the one shown in FIG. 4 except that only the insulating structure 13 is formed on the first insulating layer 3 as shown in FIG. 5, first, a base 1 on which an auxiliary electrode 2 is formed is prepared, and then the auxiliary electrode 2 in regions where the first partitions 11 demarcating a unit pixel A are to be formed is removed. Then, the first partitions 11 are formed at predetermined positions, and then a first insulating layer 3 is formed in the demarcated area formed by the first partitions 11. Then, an insulating structure 13 is formed on the first insulating layer 3 in a predetermined pattern. Then, a charge injection layer 4 is formed between the first partitions 11 and the insulating structure 13. Then, the laminated bodies 9 are formed on the charge injection layer 4. Then, the organic light-emitting layer 7 and the second electrode 8 are sequentially formed in the same manner as described above, whereby the organic light-emitting element 40 having the configuration shown in FIG. 5 is produced.

For the organic light-emitting element 50 having the second partitions 12 all on the first insulating layer 3 as shown in FIG. 6, the first partitions 11, the auxiliary electrode 2, and the first insulating layer 3 are sequentially formed on the base in the same manner as described for FIGS. 4 and 5. Then, the laminated bodies 9 are formed on the first insulating layer 3 in a predetermined pattern. Then, a charge injection layer 4 is formed between the second partitions 12, 12 and between the second partition 12 and the first partition 11 and, then, an organic light-emitting layer 7 having a uniform thickness T is formed on the charge injection layer 4. Then, a second electrode 8 is formed to cover the entire structure, whereby the organic light-emitting element 50 having the configuration shown in FIG. 6 is produced.

For the organic light-emitting element 60 having the first electrode 5 below the first partitions 11 as shown in FIG. 7, the first insulating layer 3 is formed in the same manner as in FIG. 1 and, then, a first electrode 5 is formed at positions where the first partitions for demarcating a unit pixel A are to be provided. Then, the first partitions 11 are formed on the first electrode 5 in the same size as the first electrode 5 in a plan view to demarcate a unit pixel A. Then, a charge injection layer 4 is formed in the demarcated area and, then, a first electrode 5 is formed on the charge injection layer 4 in a predetermined pattern and a second insulating layer 6 is further formed on the first electrode 5 in the same size as the first electrode 5 in a plan view to form a laminated body 9. Additionally, the insulating structures 13 are formed in a predetermined pattern on the charge electrode layer 4 within the demarcated area. With the laminated body 9 serving as the second partition 12 and the insulating structures 13 also serving as the second partition 12, an organic light-emitting layer 7 having a uniform thickness T is formed between the second partitions 12, 12 and between the second partition 12 and the first partition 11. Then, a second electrode 8 is formed to cover the entire structure, whereby the organic light-emitting element 60 having the configuration shown in FIG. 7 is produced.

The organic EL element 70 shown in FIG. 8 is also produced in the same manner as the above described organic light-emitting elements.

(Organic light-emitting transistor and light-emitting display device) The organic light-emitting transistor and light-emitting display device of the present invention will be described hereafter. However, they are not confined to the following description. The organic light-emitting transistor of the present invention is configured by arranging on a base sheet the above described organic light-emitting element of the present invention in a matrix, having the above described organic light-emitting element of the present invention, a first voltage supply device for applying a constant voltage (the drain voltage $V_D$) between the first electrode 5 and second electrode 8 of the organic light-emitting element, and a second voltage supply device for applying a variable voltage (the gate voltage $V_G$) between the first electrode 5 and auxiliary electrode 2 of the organic light-emitting element.

Figure 20:
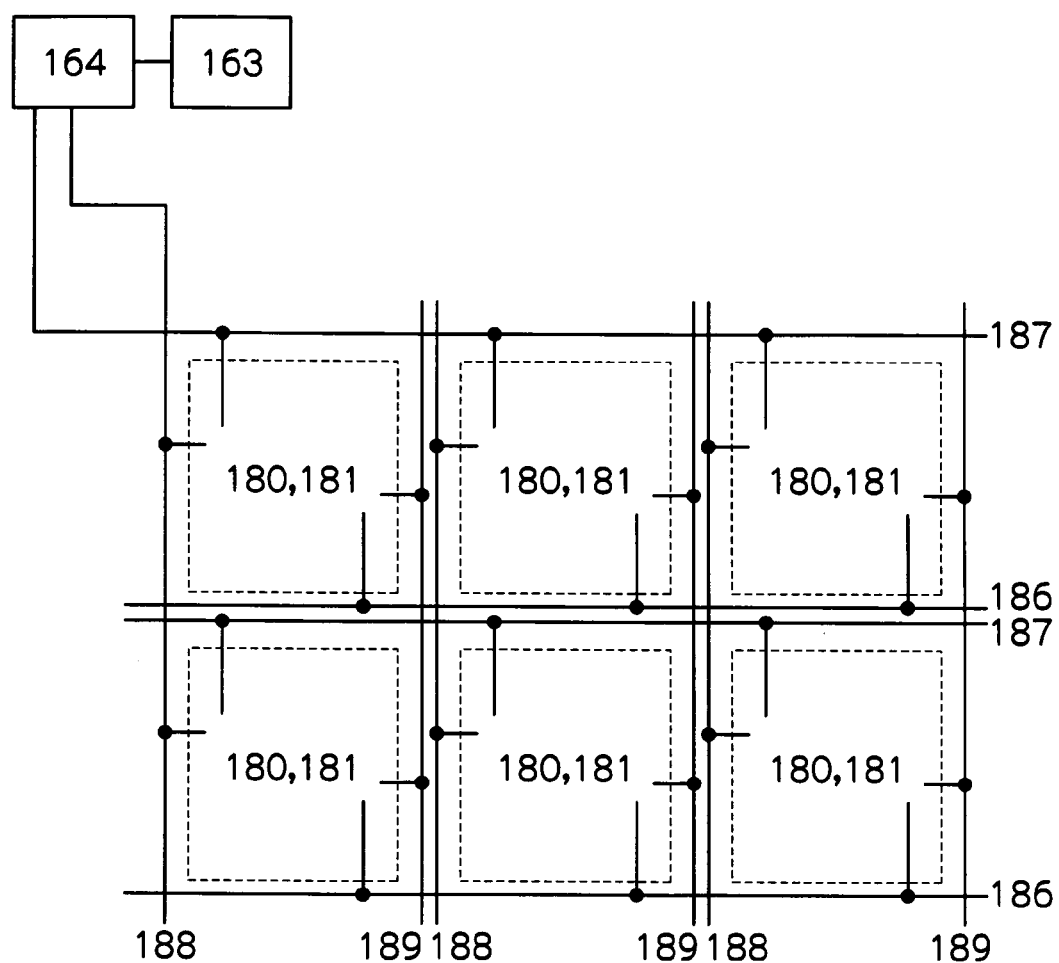
FIG. 20 illustrates a schematic diagram showing a light-emitting display device in which the organic light-emitting element of the present invention is installed.
Figure 21:
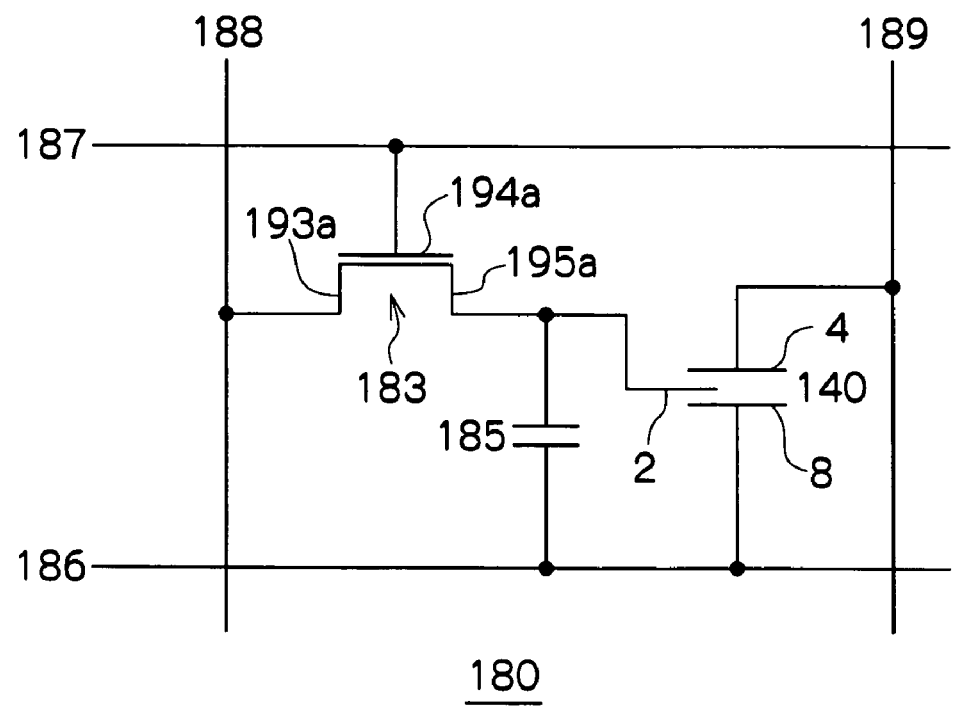
FIG. 21 illustrates a schematic circuit diagram showing an organic light-emitting transistor provided as the pixel (unit element) in the light-emitting display device and having the organic light-emitting element of the present invention.

The light-emitting display device of the resent invention is a light-emitting display device having a plurality of light-emitting parts arranged in a matrix, the plurality of light-emitting parts each having the above described organic light-emitting element of the present invention. FIG. 20 illustrates a schematic diagram showing a typical light-emitting display device in which the organic light-emitting element of the present invention is installed. FIG. 21 illustrates a schematic circuit diagram showing an organic light-emitting transistor provided as a pixel (unit element) 180 in the organic light-emitting display device and having the organic light-emitting element of the present invention. This light-emitting display device manifests an embodiment in which each pixel (unit element) 180 has a single switching transistor.

The individual pixel 180 shown in FIG. 21 is connected to a first switching wiring 187 and a second switching wiring 188, which are arranged horizontally and vertically. The first switching wiring 187 and the second switching wiring 188 are connected to a voltage control circuit 164 and the voltage control circuit 164 is connected to an image signal supply source 163 as shown in FIG. 20. In FIGS. 20 and 21, the reference numbers 186 and 189 present a ground wiring and a constant voltage applying line, respectively.

In FIG. 21, a first switching transistor 183 has a source 193a connected to the second switching wiring 188, a gate 194a connected to the first switching wiring 187, and a drain 195a connected either to the auxiliary electrode 2 of an organic light-emitting transistor 140 or to one of the terminals of a voltage retention capacitor 185. The other terminal of the voltage retention capacitor 185 is connected to the ground 186. The second electrode 8 of the organic light-emitting transistor 140 is connected to the ground 186 and the first electrode 5 of the organic light-emitting transistor 140 is connected to the constant voltage applying line 189.

Operation of the circuit shown in FIG. 21 will be described hereafter. With a voltage being applied to the first switching wiring 187, the voltage is applied to the gate 194a of the first switching transistor 183. Then, the source 193a and drain 195a become conductive. In this state, with a voltage being applied to the second switching wiring 188, the voltage is applied to the drain 195a, whereby the charge is retained in the voltage retention capacitor 185. Consequently, even if the voltage to the first switching wiring 187 or to the second switching wiring 188 is cut off, the voltage is continuously applied to the auxiliary electrode 2 of the organic light-emitting transistor 140 until the charge retained in the voltage retention capacitor 185 is exhausted. With a voltage being applied to the first electrode 5 of the organic light-emitting transistor 140, the first electrode 5 and the second electrode 8 become conductive, and then a current flows from the constant voltage applying line 189 to the ground 186 via the organic light-emitting transistor 140, whereby the organic transistor 140 emits light.

Figure 22:
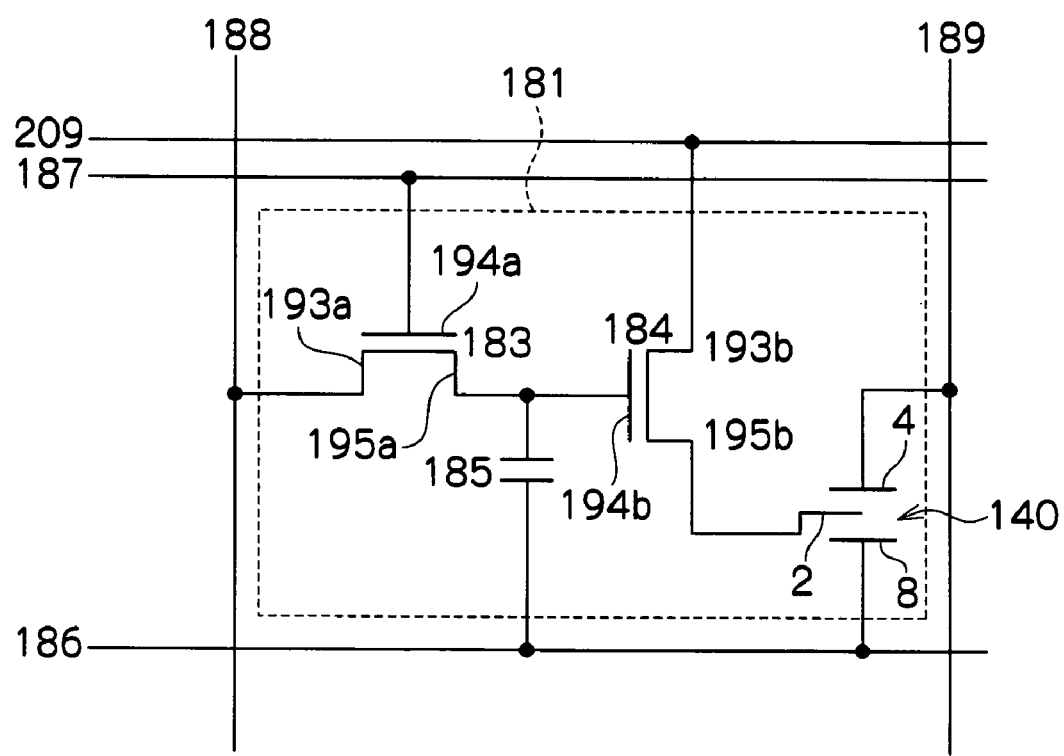
FIG. 22 illustrates a schematic circuit diagram showing another organic light-emitting transistor provided as the pixel (unit element) in the light-emitting display device and having the organic light-emitting element of the present invention.
Figure 23:
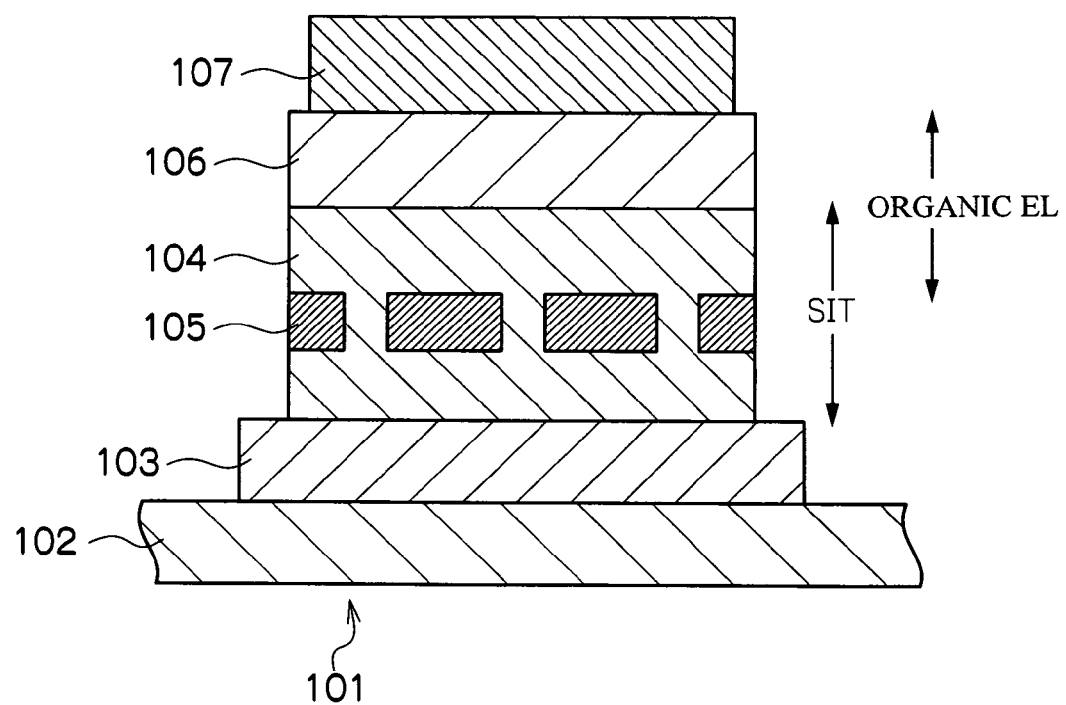
FIG. 23 illustrates a cross-sectional view showing the structure of a prior art organic light-emitting transistor combining the SIT structure and organic EL element structure.
Figure 24:
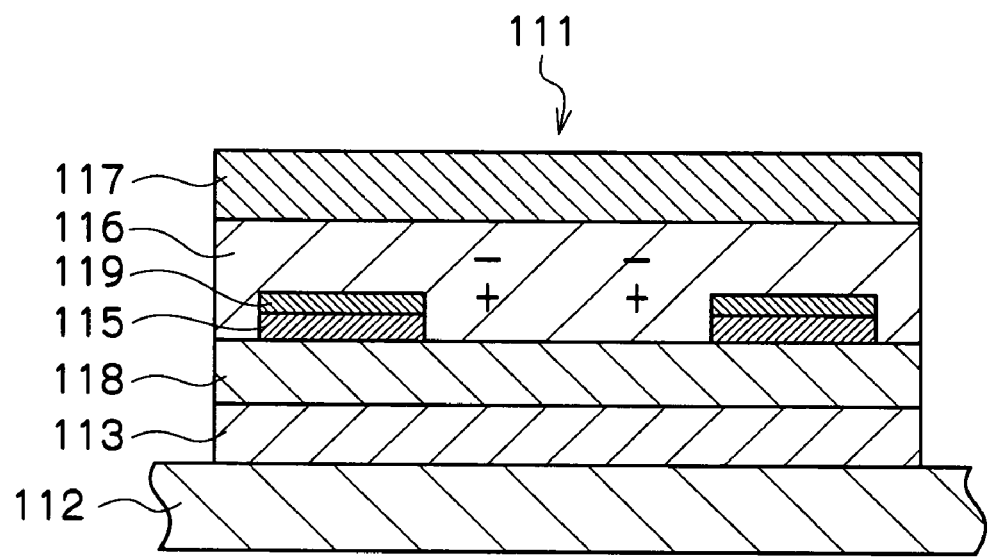
FIG. 24 illustrates a cross-sectional view showing the structure of an organic light-emitting transistor combining the bottom contact type FET structure and organic EL element structure.

FIG. 22 illustrates a schematic circuit diagram showing another organic light-emitting transistor provided as a pixel (unit element) 181 of the organic light-emitting display device and having the organic light-emitting element of the present invention. This light-emitting display device manifests an embodiment in which each pixel (unit element) 181 has two switching transistors.

The individual pixel 181 shown in FIG. 22 is connected to a first switching wiring 187 and a second switching wiring 188, which are arranged horizontally and vertically, as in the case of FIG. 21. The first switching wiring 187 and second switching wiring 188 are connected to a voltage control circuit 164 and the voltage control circuit 164 is connected to an image signal supply source 163 as shown in FIG. 20. In FIG. 22, the reference numbers 186, 209, and 189 present a ground wiring, a current supply line, and a constant voltage applying line, respectively In FIG. 22, a first switching transistor 183 has a source 193a connected to the second switching wiring 188, a gate 194a connected to the first switching wiring 187, and a drain 195a connected either to the gate 194b of a second switching transistor 184 or to one of the terminals of a voltage retention capacitor 185. The other terminal of the voltage retention capacitor 185 is connected to the ground 186. A second switching transistor has a source 193b connected to a current supply line 209 and a drain 195b connected to the auxiliary electrode 2 of an organic light-emitting transistor 140. The second electrode 8 of the organic light-emitting transistor 140 is connected to the ground 186 and the first electrode 5 of the organic transistor 140 is connected to the constant voltage applying line 189.

Operation of the circuit shown in FIG. 22 will be described hereafter. With a voltage being applied to the first switching wiring 187, the voltage is applied to the gate 194a of the first switching transistor 183. Then, the source 193a and drain 195a become conductive. In this state, with a voltage being applied to the second switching wiring 188, the voltage is applied to the drain 195a and the charge is retained in the voltage retention capacitor 185. Consequently, even if the voltage to the first switching wiring 187 or to the second switching wiring 188 is cut off, the voltage is continuously applied to the gate 194b of the second switching transistor 184 until the charge retained in the voltage retention capacitor 185 is exhausted. With a voltage being applied to the gate 194b of the second transistor 184, the source 193b and drain 195b become conductive and a current flow from the constant voltage applying line 189 to the ground via the organic light-emitting transistor 140, whereby the organic light-emitting transistor 140 emits light.

The image signal supply source 163 shown in FIG. 20 transforms electric signals from a device that reproduces image information recorded on an image information medium built in or connected to the device or from a device that transforms input electromagnetic information into electric signals into an electric signal format acceptable to the voltage control device 164 and sends them to the voltage control device 164. The voltage control device 164 further transforms the electric signals from the image signal supply source 163, calculates the duration of emission of individual pixels 180 or 181, and determines the voltage applied to the first switching wiring 187 and second switching wiring 188, duration, and time. In this way, the light-emitting display device can display a desired image based on image information. With adjacent fine pixels being adjusted for emitting three, R, G, and B, color lights, namely red-based, green-based, and blue-based color lights, a color image display device can be obtained.

As described above, the organic light-emitting transistor of the present invention has a first voltage supply means for applying a constant voltage between the first electrode 5 and second electrode 8 of the organic light-emitting element of the present invention and a second voltage supply device for applying a variable voltage between the first electrode 5 and auxiliary electrode 2 of the organic light-emitting element of the present invention, whereby a constant voltage can be applied between the first electrode 5 and second electrode 8 and a variable voltage can be applied between the first electrode 5 and auxiliary electrode 2. Consequently, with the voltage being controlled, the quantity of the charge can be changed in a sensitive manner so as to control the current flow between the first electrode 5 and the second electrode 8 for controlling the light emission quantity.

The light-emitting display device of the present invention has a plurality of light-emitting parts arranged in a matrix, the light-emitting parts each having the organic light-emitting element of the present invention, whereby a large light-emitting panel, such as a sign display, comprising the organic light-emitting element having a large number of unit pixels A in which a uniform organic light-emitting layer 7 is formed can be realized.

EMBODIMENTS

The present invention will be described further in detail hereafter using Embodiments and Comparative Embodiments.

Embodiment 1

On a glass base 1 with an ITO film having a thickness of 100 nm as the auxiliary electrode 2, a PVP photoresist (ex Tokyo Ohka Kogyo; trade name: TMR-P10) film as the first insulating layer 3 was formed to a thickness of 300 nm by spin coating. Then, a photoresist (ex Tokyo Ohka Kogyo; trade name: TFR-H) film as the first partition forming material was formed to a thickness of 1.0 μm on the first insulating layer 3. First partitions 11 (four sides) having a width of 50 μm and a height of 1 μm were formed by photolithography to demarcate a unit pixel A and, simultaneously, insulating structures 13 having a width of 20 μm and a height of 1 μm were formed. Then, a form of poly 3 hexylthiophene (50 nm in thickness) as the charge (holes) injection layer 4 was formed on the insulating layer 3 within the demarcated area by an ink-jet technique. Furthermore, an Au film (30 nm in thickness) as the first electrode 5 (positive electrode) was formed on the charge injection layer 4 by mask deposition. A positive type photoresist (ex Tokyo Ohka Kogyo; trade name: TFR-H) was applied by spin coating to cover the first electrode 5. Then, the positive type photoresist film between the first electrodes (positive electrodes) was exposed to exposure light containing g, h, and i rays from the base side and developed using an alkali developing solution (trade name: NMD-3) to form a resist film (10 μm in thickness) as the second insulating layer 6 only on the first electrode 5. The other resist film was removed to form the laminated bodies 9. Then, an application layer of an organic light-emitting material, polyfluorene copolymer (ex American Dye Source; trade name: ADS132GE), was formed on the charge injection layer 4 between the laminated body 9 and insulating structure 13 to a thickness 80 nm by ink-jet technique. Then, Ca (50 nm in thickness) as the electron injection layer and Ag (100 nm in thickness) as the second electrode 8 were deposited in this order to cover the entire structure, whereby the organic light-emitting element of Embodiment 1 was produced.

Here, Embodiment 1 had the partition configuration shown in FIG. 17 in a plan view. The unit pixel A was 2.25 mm wide×2.0 mm long. The first partitions 11 had a width of 50 μm; the insulating structures 13, 20 μm; and the laminated bodies 9, 20 μm. The insulating structures 13 were apart from each other by 0.35 mm in the coating region D. The laminated bodies 9 were provided in the coating region between the insulating structures 13 and between the insulating structure 13 and first partition 11 at the midpoint in parallel in the transversal direction. Then, a coating of ink for forming the organic light-emitting layer was formed in the coating region D formed by these partitions using an ink-jet device discharging 40 picoliters per shot. The partitions were slightly ink-repellent. The top surface of the second partitions 12 was at a higher level than the top surface of the first partitions 11 by 80 nm and than the top surface of the organic light-emitting layer 7 by 870 nm. The organic light-emitting layer 7 had an average thickness of 100 nm with a deviation of ±5% or smaller in any part. The thickness was determined based on nine measurements obtained using a desktop type small probe microscope Nanopics 1000.

The voltage applied between the auxiliary electrode 2 and the first electrode 5 (the gate voltage $V_G$) of the obtained organic light-emitting element was changed in a range from +20V to −50V while a voltage of −14V was applied between the first electrode 5 and second electrode 8 (the drain voltage $V_D$). Meanwhile, the obtained luminescence was visually observed and any uneven light emission was not observed under the above range of variable voltage.

Embodiment 2

The layers were formed in the same layer structure as in Embodiment 1. However, the organic light-emitting element of Embodiment 2 had the partition configuration shown in FIG. 17. The unit pixel A was 2.25 mm wide×2.0 mm long. The first partitions 11 had a width of 50 μm and the third partitions had a width of 10 μm. The insulating structures 13 were not connected to the first partitions 11 and arranged in parallel at a pitch of 150 μm in the transversal direction. A coating of poly 3 hexylthiophene ink as the charge (holes) injection layer 4 was formed in the coating region D formed by these partitions using an ink-jet device discharging 40 picoliters per shot. The partitions were slightly ink-repellent. The top surfaces of the first partitions 11 and insulating structures 13 were at the same level, which was higher than the top surface of the charge (holes) injection layer 4 by 950 nm. The charge (holes) injection layer 4 had an average thickness of 50 nm with a deviation of ±5% or smaller in any part. Then, the laminated body 9 was formed in the same method as in Embodiment 1. A coating of ink for forming the organic light-emitting layer was formed in the coating region D formed by these partitions using an ink-jet device discharging 40 picoliters per shot. The partitions were slightly ink-repellent. The top surface of the laminated body 9 was at a higher level than the top surfaces of the first partitions 11 and insulating structure 13 by 50 nm and than the top surface of the organic light-emitting layer 7 by 950 nm. The organic light-emitting layer 7 had an average thickness of 80 nm with a deviation of ±5% or smaller in any part.

The voltage applied between the auxiliary electrode 2 and the first electrode 5 (the gate voltage $V_G$) of the obtained organic light-emitting element was changed in a range from +20V to −50V while a voltage of −14V was applied between the first electrode 5 and the second electrode 8 (the drain voltage $V_D$). Meanwhile, the obtained luminescence was visually observed and any uneven light emission was not observed under the above range of variable voltage.

Embodiment 3

On a glass base 1 with an ITO film having a thickness of 100 nm as the auxiliary electrode 2, a PVP photoresist (ex Tokyo Ohka Kogyo; trade name: TMR-P10) film as the first insulating layer 3 was formed to a thickness of 300 nm by spin coating. Then, a photoresist (ex Tokyo Ohka Kogyo; trade name: TFR-H) film as the first partition forming material was formed on the first insulating layer 3 to a thickness of 1.0 μm. First partitions 11 (four sides) having a width of 50 μm and a height of 1 μm were formed by photolithography to demarcate a unit pixel A and, simultaneously, insulating structures 13 having a width of 20 μm and a height of 1 μm were formed by the same photolithography. Then, an Au (30 nm in thickness) film as the first electrode 5 (positive electrode) was formed on the first insulating layer 3 in the demarcated area by mask deposition and, then, a positive type photoresist (ex Tokyo Ohka Kogyo; trade name: TFR-H) was applied by spin coating to cover the first electrode 5. Then, the positive type photoresist film between the first electrodes 5 (positive electrodes) was exposed to exposure light containing g, h, and i rays from the base side and developed using an alkali developing solution (trade name: NMD-3) to form a resist film (1.0 μm in thickness) as the second insulating layer 6 only on the first electrode 5. The other resist film was removed to form laminated bodies 9. Then, a coating of poly 3 hexylthiophene (80 nm in thickness) as the charge (holes) injection layer 4 was formed on the first insulating layer 3 between the laminated body 9 and insulating structure 13 and between the laminated body 9 and the first partition 11 by ink-jet technique. A coating of an organic light-emitting material, polyfluorene copolymer (ex American Dye Source; trade name: ADS259BE), was formed on the charge injection layer 4 to a thickness of 80 nm by ink-jet technique. Then, Ca (50 nm in thickness) as the electron injection layer and Ag (100 nm in thickness) as the second electrode 8 were deposited by vacuum deposition in this order to cover the entire structure, whereby the organic transistor of Embodiment 3 was produced.

Embodiment 3 had the partition configuration shown in FIG. 17 in a plan view as in Embodiment 1. The unit pixel A was 2.25 mm wide×2.0 mm long. The first partitions 11 had a width of 50 μm; the insulating structures 13, 20 μm; and the laminated bodies 9, 20 μm. The insulating structures 13 were apart from each other by 0.35 mm in the coating region D. The laminated bodies 9 were placed in the coating region D between the insulating structures 13 and between the insulating structure 13 and first partition 11 at the midpoint in the transversal direction. A coating of ink for forming the organic light-emitting layer was formed in the coating region D formed by these partitions using an ink-jet device discharging 40 picoliters per shot. The partitions were slightly ink-repellent. The top surface of the second partitions 12 was at a higher level than the top surface of the first partitions 11 by 80 nm and than the top surface of the organic light-emitting layer 7 by 870 nm. The organic light-emitting layer 7 had an average thickness of 100 nm with a deviation of ±5% or smaller in any part. The thickness was determined based on nine measurements obtained using a desktop type small probe microscope Nanopics 1000.

The voltage applied between the auxiliary electrode 2 and first electrode 5 (the gate voltage $V_G$) of the obtained organic light-emitting element was changed in a range from +20V to −50V while a voltage of −14V was applied between the first electrode 5 and second electrode 8 (the drain voltage $V_D$). Meanwhile, the obtained luminescence was visually observed and any uneven light emission was not observed under the above range of variable voltage.

Comparative Embodiment 1

An organic light-emitting element of Comparative Embodiment 1 was produced in the same manner as in Embodiment 1 except that the insulating structure 13 and laminated body 9 were omitted.

Comparative Embodiment 2

An organic light-emitting element of Comparative Embodiment 2 was produced in the same manner as in Embodiment 2 except that the insulating structure 13 and laminated body 9 were omitted.

(Assessment) The light-omitting surfaces of the organic light-emitting elements of Comparative Embodiments 1 and 2 were observed using a stereomicroscope (manufactured by LEICA) and an uneven light emission was visually observed in both embodiments.

DESCRIPTION OF NOTATIONS 10, 20, 30, 40, 50, 60 organic light-emitting element
1 base
2 auxiliary electrode
3 first insulating layer
4 charge injection layer
5 first electrode
5a bottom surface of the first electrode
5b end surface of the first electrode
6 second insulating layer
7 organic light-emitting layer
8 second electrode
9 laminated body
11 first partition
12 second partition
13 insulating structure
61 base
62 A-electrode
63 charge injection layer
64 organic light-emitting layer
65 B-electrode
70 organic EL element
140 organic transistor
163 image signal supply source
164 voltage control circuit
180, 181 pixel
183 first switching transistor
184 second switching transistor
185 voltage retention capacitor
186 ground wiring
187 first switching wiring
188 second switching wiring
189 constant voltage applying line
193a source of the first switching transistor
193b source of the second switching transistor
194a gate of the first switching transistor
194b gate of the second switching transistor
195a drain of the first switching transistor
195b drain of the second switching transistor
209 current supply line
$V_G$ gate voltage
$V_D$ drain voltage
A unit pixel
D coating region
Sα Sβ, A1, S2, S3, S4 subregion
T thickness of the organic light-emitting layer
T1 thickness of the first electrode
T2 thickness of the second insulating layer
T3 thickness of the insulating structure
T4 thickness of the first partition

The invention claimed is:

1. An organic light-emitting element comprising a plurality of unit pixels, each of the unit pixels including:
a base;
a single auxiliary electrode provided on the base;
a first insulating layer provided so as to cover at least the single auxiliary electrode;
a charge injection layer provided on the first insulating layer above the single auxiliary electrode;
a laminated body having a first electrode and a second insulating layer and provided either on the first insulating layer or on the charge injection layer in a predetermined pattern;
an organic light-emitting layer formed by coating on the charge injection layer in a region where the laminated body is not provided; and
a second electrode provided so as to cover at least the organic light-emitting layer, wherein
each of the unit pixels has first partitions configured to divide a periphery of the organic light-emitting layer and to separate the organic light-emitting layer from other adjacent unit pixels and has one or more second partitions that are provided between the first partitions, the one or more second partitions dividing the organic light-emitting layer so as to have a uniform coating thickness,
at least one of the first and second partitions is formed by the laminated body, and
the first electrode is physically and electrically connected to the second electrode via the organic light-emitting layer, or via the organic light-emitting layer and the charge injection layer.

2. The organic light-emitting element according to claim 1, wherein the one or more second partitions have an insulating structure having a predetermined pattern.

3. The organic light-emitting element according to claim 1, wherein the one or more second partitions are spaced from the first partitions.

4. The organic light-emitting element according to claim 1, wherein two or more of the second partitions are spaced from each other.

5. The organic light-emitting element according to claim 1, wherein the one or more second partitions have a columnar structure.

6. The organic light-emitting element according to claim 5, wherein each of the unit pixels has a surface area of $0.25 \text{ mm}^2$ or larger.

7. The organic light-emitting element according to claim 1, wherein area density of distribution of the second partitions is the same throughout the unit pixels.

8. The organic light-emitting element according to claim 1, wherein the charge injection layer is formed by coating.

9. An organic light-emitting transistor comprising:
the organic light-emitting element according to claim 1,
a first voltage supply device that applies a constant voltage between the first and second electrodes of the organic light-emitting element; and
a second voltage supply device that applies a variable voltage between the first electrode and the single auxiliary electrode of the organic light-emitting element.

10. A light-emitting display device comprising a plurality of light-emitting parts arranged in a matrix, wherein each of the light-emitting parts has the organic light-emitting element according to claim 1.

11. An organic transistor element comprising a plurality of unit elements, each of the unit elements including:
a base;
a single auxiliary electrode provided on the base;
a first insulating layer provided so as to cover at least the single auxiliary electrode;
a charge injection layer provided on the first insulating layer above the single auxiliary electrode;
a laminated body having a first electrode and a second insulating layer and provided either on the first insulating layer or on the charge injection layer in a predetermined pattern;

an organic semiconductor layer formed by coating on the charge injection layer in a region where the laminated body is not provided; and a second electrode provided so as to cover at least the organic semiconductor layer, wherein each of the unit elements has first partitions configured to divide a periphery of the organic light-emitting layer and to separate the organic semiconductor layer from adjacent other unit elements and one or more second partitions that are provided between the first partitions, the one or more second partitions dividing the organic semiconductor layer so as to have a uniform coating thickness, at least one of the first and second partitions is the laminated body, and the first electrode is physically and electrically connected to the second electrode via the organic light-emitting layer, or via the organic light-emitting layer and the charge injection layer.

12. The organic transistor element according to claim 11, wherein the one or more second partitions have an insulating structure having a predetermined pattern.

13. The organic light-emitting element according to claim 1, wherein each of the unit pixels has a plurality of divided areas that is divided by the second partitions in the organic light-emitting layer of each of the unit pixels, and each of the divided areas are directly physically and electrically connected to the other divided area in the same unit pixel.

14. The organic transistor according to claim 11, wherein each of the unit pixels has a plurality of divided areas that is divided by the second partitions in the organic light-emitting layer of each of the unit pixels, and each of the divided areas are directly physically and electrically connected to the other divided area in the same unit pixel.

* * * * *